US006506505B1

(12) United States Patent
Weber et al.

(10) Patent No.: US 6,506,505 B1
(45) Date of Patent: Jan. 14, 2003

(54) CYCLOOCTATETRAENES AS ELECTRON TRANSPORTERS IN ORGANIC LIGHT EMITTING DIODES

(75) Inventors: William P. Weber, Los Angeles, CA (US); Ping Lu, Los Angeles, CA (US); Mark E. Thompson, Anaheim, CA (US); Haiping Hong, Los Angeles, CA (US)

(73) Assignee: The University of Southern California, Los Angeles, CA (US)

( * ) Notice: Subject to any disclaimer, the term of this patent is extended or adjusted under 35 U.S.C. 154(b) by 0 days.

(21) Appl. No.: 09/375,125

(22) Filed: Aug. 16, 1999

(51) Int. Cl.[7] ............................................... H05B 33/12
(52) U.S. Cl. ...................... 428/690; 428/917; 313/504; 313/506
(58) Field of Search ................ 428/690, 917; 313/504, 506

(56) References Cited

U.S. PATENT DOCUMENTS

| 5,668,824 A | * | 9/1997 | Furumoto et al. ............. 372/54 |
| 5,703,436 A | | 12/1997 | Forrest et al. ............... 313/506 |
| 5,707,745 A | | 1/1998 | Forrest et al. ............... 428/432 |
| 5,757,026 A | | 5/1998 | Forrest et al. ................ 257/40 |
| 5,757,139 A | | 5/1998 | Forrest et al. ............ 315/169.3 |
| 5,811,833 A | | 9/1998 | Thompson .................... 257/40 |
| 5,834,893 A | | 11/1998 | Bulovic et al. ............. 313/506 |
| 5,844,363 A | | 12/1998 | Gu et al. .................... 313/506 |
| 5,861,219 A | | 1/1999 | Thompson et al. .......... 428/690 |
| 5,874,803 A | | 2/1999 | Garbuzov et al. ........... 313/506 |
| 5,917,280 A | | 6/1999 | Burrows et al. ............. 313/506 |
| 5,932,895 A | | 8/1999 | Shen et al. .................... 257/89 |
| 6,350,875 B1 | * | 2/2002 | Weber et al. ................ 546/173 |

FOREIGN PATENT DOCUMENTS

| WO | 96/19792 | 6/1996 |
| WO | 97/33296 | 9/1997 |
| WO | 97/48115 | 12/1997 |
| WO | 97/48139 | 12/1997 |
| WO | 98/50989 | 11/1998 |

OTHER PUBLICATIONS

C.W. Tang, et al., "Organic Electroluminescent Diodes", 51 *Appl. Phys. Lett.*, pp. 913–915, Sep. 21, 1987.

S.R. Forrest, et al., "Organic Emitters Promise a New Generation of Displays", *Laser Focus World*, (Feb. 1995), pp. 99–107.

Baldo, et al., "Very high efficiency green organic light–emitting devices based on electrophosphorescence", 75 *Applied Physics Letters*, 4–6, Jul. 5, 1999.

C.H. Chen, et al., "Recent developments in molecular organic electroluminescent materials", *Macromolecular Symposia*, 125, 1–48 (1997), (No month).

M.A. Baldo, et al., "Highly efficient phosphorescent emission from organic electroluminescent devices", *Nature*, vol. 395, 151–154, (Sep. 1998).

H. Aziz, et al., "Degradation Mechanism of Small Molecule– Based Organic Light–Emitting Devices", *Science*, 283, 1900–1902 (Mar. 19, 1999).

C. W. Tang, et al., "Electroluminescence of doped organic films," 65 *J. Appl. Phys.*, 3610–3616, (May 1, 1989).

V. Bulovic, et al., "Bright, saturated, red–to–yellow organic light–emitting devices based on polarization–induced spectral shifts," *Chem. Phys. Lett.*, 287, 455–460 (1998) (No month).

H.J.A. Dartnall, et al., 220 *Proc. Roy. Soc. B* (London), 115–130 (1983) (No month).

H. Guo, et al., "Synthesis of High Molecular Weight Copolymers by Ruthenium–Catalyzed Step–Growth Copolymerization of Acetophenone with α,ω–Dienes", *Macromolecules*, 28, 5686–5687 (1995) (No month).

A. Vogel, *Vogel's Textbook of Practical Organic Chemistry*, 4th Ed., Longman, London, England, p. 351 (1978) (No month).

S. R. Forrest, "Ultrathin Organic Films Grown by Organic Molecular Beam Deposition and Related Techniques," Chemical Reviews, 97, pp. 1793–1896, Sep./Oct. 1997.

* cited by examiner

*Primary Examiner*—Marie Yamnitzky
(74) *Attorney, Agent, or Firm*—Kenyon & Kenyon

(57) ABSTRACT

Organic light emitting devices the emissive layer comprises a host material containing a fluorescent or phosphorescent emissive molecule, which molecule is adapted to luminesce when a voltage is applied across the heterostructure, wherein the device comprises an electron transporting layer comprising a derivative of cyclooctatetraene.

8 Claims, 20 Drawing Sheets

COT = substituted cyclooctateraene

HTL (NPD)

Photoluminescence of COT-H

Chemical Structure of CoT-H

& Other Isomers

Photoluminescence of COT-Me

Chemical Structure of CoT-Me

& Other Isomers

OLED: NPD (400A)/COT-Me (400A)

OLED: NPD (400A)/COT-H (400A)

OLED: NPD (400A)/COT-Me (200A)

OLED: NPD (400A)-1% perylene/COT-H (400A)

(I)

(II)

(III)

(IV)

R=H,CH$_3$,CH$_3$O

CYCLOOCTATETRAENES AS ELECTRON TRANSPORTERS IN ORGANIC LIGHT EMITTING DIODES

GOVERMENT RIGHTS

Figure 1:
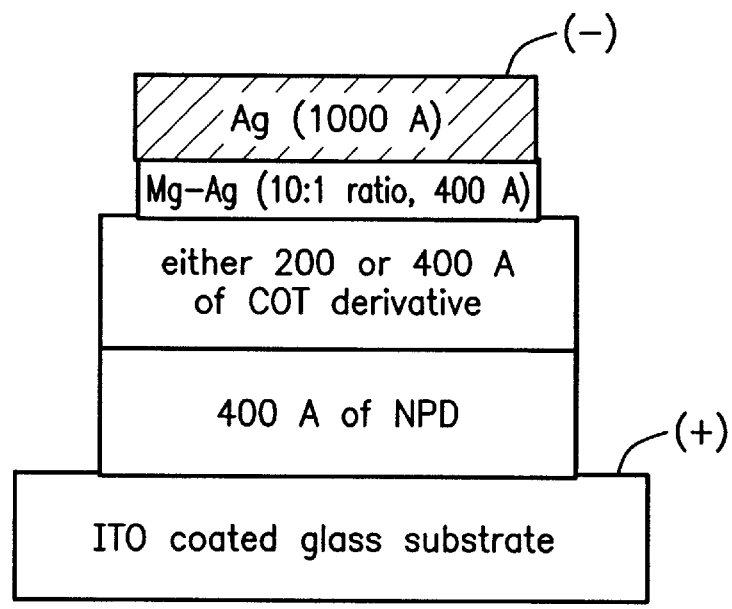
Figure 1:
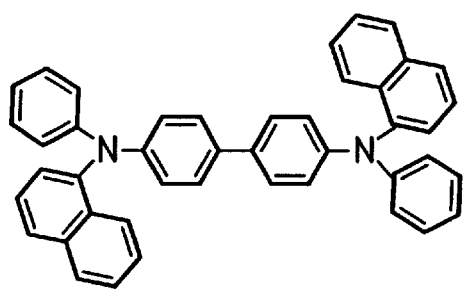

This invention was made with Goverment support under Contract No. F49620-96-1-0035 awarded by AFOSR and Contract No. 340-6100-1 awarded by the NSF. The goverment has certain rights in this invention.

I. FIELD OF INVENTION

The present invention is directed to organic light emitting devices (OLEDs) comprising an electron transporting layer ("ETL") comprising derivatives of cyclooctatetraene.

II. BACKGROUND OF THE INVENTION

II. A. General Background

Organic light emitting devices (OLEDs) are comprised of several organic layers in which one of the layers is comprised of an organic material that can be made to electroluminesce by applying a voltage across the device, C. W. Tang et al., Appl. Phys. Lett. 1987, 51, 913. Certain OLEDs have been shown to have sufficient brightness, range of color and operating lifetimes for use as a practical alternative technology to LCD-based full color flat-panel displays (S. R. Forrest, P. E. Burrows and M. E. Thompson, Laser Focus World, Feb. 1995). Since many of the thin organic films used in such devices are transparent in the visible spectral region, they allow for the realization of a completely new type of display pixel in which red (R), green (G), and blue (B) emitting OLEDs are placed in a vertically stacked geometry to provide a simple fabrication process, a small R-G-B pixel size, and a large fill factor, International Patent Application No. PCT/US95/15790.

A transparent OLED (TOLED), which represents a significant step toward realizing high resolution, independently addressable stacked R-G-B pixels, was reported in International Patent Application No. PCT/US97/02681 in which the TOLED had greater than 71% transparency when turned off and emitted light from both top and bottom device surfaces with high efficiency (approaching 1% quantum efficiency) when the device was turned on. The TOLED used transparent indium tin oxide (ITO) as the hole-injecting electrode and a Mg—Ag—ITO electrode layer for electron-injection. A device was disclosed in which the ITO side of the Mg—Ag—ITO layer was used as a hole-injecting contact for a second, different color-emitting OLED stacked on top of the TOLED. Each layer in the stacked OLED (SOLED) was independently addressable and emitted its own characteristic color. This colored emission could be transmitted through the adjacently stacked, transparent, independently addressable, organic layer or layers, the transparent contacts and the glass substrate, thus allowing the device to emit any color that could be produced by varying the relative output of the red and blue color-emitting layers.

PCT/US95/15790 application disclosed an integrated SOLED for which both intensity and color could be independently varied and controlled with external power supplies in a color tunable display device. The PCT/US95/15790 application, thus, illustrates a principle for achieving integrated, full color pixels that provide high image resolution, which is made possible by the compact pixel size. Furthermore, relatively low cost fabrication techniques, as compared with prior art methods, may be utilized for making such devices.

II.B. Background of Emission

II.B.1. Basics

II.B.1.a. Singlet and Triplet Excitons

Because light is generated in organic materials from the decay of molecular excited states or excitons, understanding their properties and interactions is crucial to the design of efficient light emitting devices currently of significant interest due to their potential uses in displays, lasers, and other illumination applications. For example, if the symmetry of an exciton is different from that of the ground state, then the radiative relaxation of the exciton is disallowed and luminescence will be slow and inefficient. Because the ground state is usually anti-symmetric under exchange of spins of electrons comprising the exciton, the decay of a symmetric exciton breaks symmetry. Such excitons are known as triplets, the term reflecting the degeneracy of the state. For every three triplet excitons that are formed by electrical excitation in an OLED, only one symmetric state (or singlet) exciton is created. (M. A. Baldo, D. F. O'Brien, M. E. Thompson and S. R. Forrest, Very high-efficiency green organic light-emitting devices based on electrophosphorescence, Applied Physics Letters, 1999, 75, 4–6.) Luminescence from a symmetry-disallowed process is known as phosphorescence. Characteristically, phosphorescence may persist for up to several seconds after excitation due to the low probability of the transition. In contrast, fluorescence originates in the rapid decay of a singlet exciton. Since this process occurs between states of like symmetry, it may be very efficient.

Many organic materials exhibit fluorescence from singlet excitons. However, only a very few have been identified which are also capable of efficient room temperature phosphorescence from triplets. Thus, in most fluorescent dyes, the energy contained in the triplet states is wasted. However, if the triplet excited state is perturbed, for example, through spin-orbit coupling (typically introduced by the presence of a heavy metal atom), then efficient phosphoresence is more likely. In this case, the triplet exciton assumes some singlet character and it has a higher probability of radiative decay to the ground state. Indeed, phosphorescent dyes with these properties have demonstrated high efficiency electroluminescence.

Only a few organic materials have been identified which show efficient room temperature phosphorescence from triplets. In contrast, many fluorescent dyes are known (C. H. Chen, J. Shi, and C. W. Tang, "Recent developments in molecular organic electroluminescent materials," Macromolecular Symposia, 1997, 125, 1–48; U. Brackmann, Lambdachrome Laser Dyes (Lambda Physik, Gottingen, 1997) and fluorescent efficiencies in solution approaching 100% are not uncommon. (C. H. Chen, 1997, op. cit.) Fluorescence is also not affected by triplet-triplet annihilation, which degrades phosphorescent emission at high excitation densities. (M. A. Baldo, et al., "High efficiency phosphorescent emission from organic electroluminescent devices," Nature, 1998, 395, 151–154; M. A. Baldo, M. E. Thompson, and S. R. Forrest, "An analytic model of triplet-triplet annihilation in electrophosphorescent devices," 1999). Consequently, fluorescent materials are suited to many electroluminescent applications, particularly passive matrix displays.

II.B.1.b. Overview of Invention Relative to Basics

This invention pertains to the use of cyclooctatetraene derivatives to enhance the performance of organic light emitting devices ("OLEDs").

A great deal of work has been done to optimize OLEDs. The materials for the hole transporting layer have been extensively engineered to achieve maximum efficiency and lifetime for the devices. However, the best devices to date are still made with the same electron transporting material that was reported in the seminal paper by Tang and Van Slyke, Appl. Phys. Lett. 1987, 51, 913. which material is tris-(8-hydroxyquinoline) aluminum ("Alq3"). While Alq3 has a good electron mobility and gives OLEDs with long lifetimes, it is chemically unstable and hole injection into the material appears to lead to degradation of the Alq3 (H. Aziz, Z. D. Popovich, et al., Science, 283, 1900–1902 (Mar. 19, 1999)). Other materials have been explored as ETLs, but none has proven to be as effective as Alq3.

A family of cyclooctatetraenes (COTs) has been prepared and tested as electron transporting agents in OLEDs. The goal here is to replace the Alq3 ETL of conventional OLEDs with a different, better material. The COT derivatives have a high energy gap, emitting in the blue to violet region of the visible spectrum and are very thermally stable (the glass transition temperature, Tg, >150° C.). They have low volatility, making them ideal for vacuum deposition and they form stable glassy films. They are hydrolytically stable and they are compatible with a wide range of substrates and materials. Prior to this work it was not known if these materials would transport holes or electrons in optoelectronic devices.

Embodiments of the present invention are discussed in detail in the examples below. However, the embodiments may operate by different mechanisms. Without limiting the scope of the invention, we discuss the different mechanisms.

II.B.1.c. Dexter and Förster Mechanisms

To understand the different embodiments of this invention it is useful to discuss the underlying mechanistic theory of energy transfer. There are two mechanisms commonly discussed for the transfer of energy to an acceptor molecule. In the first mechanism of Dexter transport (D. L. Dexter, "A theory of sensitized luminescence in solids," J. Chem. Phys., 1953, 21, 836–850), the exciton may hop directly from one molecule to the next. This is a short-range process dependent on the overlap of molecular orbitals of neighboring molecules. It also preserves the symmetry of the donor and acceptor pair (E. Wigner and E. W. Wittmer, Uber die Struktur der zweiatomigen Molekelspektren nach der Quantenmechanik, Zeitschrift fur Physik, 1928, 51, 859–886; M. Klessinger and J. Michl, Excited states and photochemistry of organic molecules (VCH Publishers, New York, 1995). Thus, the energy transfer of Eq. (1) is not possible via Dexter mechanism. In the second mechanism of Förster transfer (T. Förster, Zwischenmolekulare Energiewanderung and Fluoreszenz, Annalen der Physik, 1948, 2, 55–75; T. Förster, Fluoreszenz organischer Verbindugen (Vandenhoek and Ruprecht, Gottinghen, 1951), the energy transfer of Eq. (1) is possible. In Förster transfer, similar to a transmitter and an antenna, dipoles on the donor and acceptor molecules couple and energy may be transferred. Dipoles are generated from allowed transitions in both donor and acceptor molecules. This typically restricts the Förster mechanism to transfers between singlet states.

Nevertheless, as long as the phosphor can emit light due to some perturbation of the state such as due to spin-orbit coupling introduced by a heavy metal atom, it may participate as the donor in Förster transfer. The efficiency of the process is determined by the luminescent efficiency of the phosphor (F Wilkinson, in Advances in Photochemistry (eds. W. A. Noyes, G. Hammond, and J. N. Pitts, pp. 241–268, John Wiley & Sons, New York, 1964), i.e. if a radiative transition is more probable than a non-radiative decay, then energy transfer will be efficient. Such triplet-singlet transfers were predicted by Förster (T. Förster,"Transfer mechanisms of electronic excitation," Discussions of the Faraday Society, 1959, 27, 7–17) and confirmed by Ermolaev and Sveshnikova (V. L. Ermolaev and E. B. Sveshnikova, "Inductive-resonance transfer of energy from aromatic molecules in the triplet state," Doklady Akademii Nauk SSSR, 1963, 149, 1295–1298), who detected the energy transfer using a range of phosphorescent donors and fluorescent acceptors in rigid media at 77 K or 90 K. Large transfer distances are observed; for example, with triphenylamine as the donor and chrysoidine as the acceptor, the interaction range is 52 Å.

The remaining condition for Förster transfer is that the absorption spectrum should overlap the emission spectrum of the donor assuming the energy levels between the excited and ground state molecular pair are in resonance. In Example 1 of this application, we use the green phosphor fac tris(2-phenylpyridine) iridium (Ir(ppy)$_3$; M. A. Baldo, et al., Appl. Phys. Lett., 1999, 75, 4–6) and the red fluorescent dye [2-methyl-6-[2-(2,3,6,7-tetrahydro-1H,5H-benzo[ij] quinolizin-9-yl)ethenyl]-4H-pyran-ylidene]propanedinitrile] ("DCM2"; C. W. Tang, S. A. VanSlyke, and C. H. Chen, "Electroluminescence of doped organic films," J. Appl. Phys., 1989, 65, 3610–3616). DCM2 absorbs in the green, and, depending on the local polarization field (V. Bulovic, et al., "Bright, saturated, red-to-yellow organic light-emitting devices based on polarization-induced spectral shifts," Chem. Phys. Lett., 1998, 287, 455–460), it emits at wavelengths between $\lambda$=570 nm and $\lambda$=650 nm.

It is possible to implement Förster energy transfer from a triplet state by doping a fluorescent guest into a phosphorescent host material. Unfortunately, such systems are affected by competitive energy transfer mechanisms that degrade the overall efficiency. In particular, the close proximity of the host and guest increase the likelihood of Dexter transfer between the host to the guest triplets. Once excitons reach the guest triplet state, they are effectively lost since these fluorescent dyes typically exhibit extremely inefficient phosphorescence.

To maximize the transfer of host triplets to fluorescent dye singlets, it is desirable to maximize Dexter transfer into the triplet state of the phosphor while also minimizing transfer into the triplet state of the fluorescent dye. Since the Dexter mechanism transfers energy between neighboring molecules, reducing the concentration of the fluorescent dye decreases the probability of triplet-triplet transfer to the dye. On the other hand, long range Förster transfer to the singlet state is unaffected. In contrast, transfer into the triplet state of the phosphor is necessary to harness host triplets, and may be improved by increasing the concentration of the phosphor.

II.B.2. Interrelation of Device Structure and Emission

Devices whose structure is based upon the use of layers of organic optoelectronic materials generally rely on a common mechanism leading to optical emission. Typically, this mechanism is based upon the radiative recombination of a trapped charge. Specifically, OLEDs are comprised of at least two thin organic layers separating the anode and cathode of the device. The material of one of these layers is specifically chosen based on the material's ability to transport holes, a "hole transporting layer" (HTL), and the material of the other layer is specifically selected according to its ability to transport electrons, an "electron transporting layer" (ETL). With such a construction, the device can be viewed as a diode with a forward bias when the potential applied to the anode is higher than the potential applied to the cathode. Under these bias conditions, the anode injects holes (positive charge carriers) into the hole transporting layer, while the cathode injects electrons into the electron transporting layer. The portion of the luminescent medium adjacent to the anode thus forms a hole injecting and transporting zone while the portion of the luminescent medium adjacent to the cathode forms an electron injecting and transporting zone. The injected holes and electrons each migrate toward the oppositely charged electrode. When an electron and hole localize on the same molecule, a Frenkel exciton is formed. Recombination of this short-lived state may be visualized as an electron dropping from its conduction potential to a valence band, with relaxation occurring, under certain conditions, preferentially via a photoemissive mechanism. Under this view of the mechanism of operation of typical thin-layer organic devices, the electroluminescent layer comprises a luminescence zone receiving mobile charge carriers (electrons and holes) from each electrode.

As noted above, light emission from OLEDs is typically via fluorescence or phosphorescence. There are issues with the use of phosphorescence. It has been noted that phosphorescent efficiency can decrease rapidly at high current densities. It may be that long phosphorescent lifetimes cause saturation of emissive sites, and triplet-triplet annihilation may also produce efficiency losses. Another difference between fluorescence and phosphorescence is that energy transfer of triplets from a conductive host to a luminescent guest molecule is typically slower than that of singlets; the long range dipole-dipole coupling (Förster transfer) which dominates energy transfer of singlets is (theoretically) forbidden for triplets by the principle of spin symmetry conservation. Thus, for triplets, energy transfer typically occurs by diffusion of excitons to neighboring molecules (Dexter transfer); significant overlap of donor and acceptor excitonic wavefunctions is critical to energy transfer. Another issue is that triplet diffusion lengths are typically long (e.g., >1400 Å) compared with typical singlet diffusion lengths of about 200 Å. Thus, if phosphorescent devices are to achieve their potential, device structures need to be optimized for triplet properties. In this invention, we exploit the property of long triplet diffusion lengths to improve external quantum efficiency.

Successful utilization of phosphorescence holds enormous promise for organic electroluminescent devices. For example, an advantage of phosphorescence is that all excitons (formed by the recombination of holes and electrons in an EL), which are (in part) triplet-based in phosphorescent devices, may participate in energy transfer and luminescence in certain electroluminescent materials. In contrast, only a small percentage of excitons in fluorescent devices, which are singlet-based, result in fluorescent luminescence.

An alternative is to use phosphorescence processes to improve the efficiency of fluorescence processes. Fluorescence is in principle 75% less efficient due the three times higher number of symmetric excited states.

II.C. Background of Materials
II.C.1. Basic Heterostructures

Because one typically has at least one electron transporting layer and at least one hole transporting layer, one has layers of different materials, forming a heterostructure. The materials that produce the electroluminescent emission may be the same materials that function either as the electron transporting layer or as the hole transporting layer. Such devices in which the electron transporting layer or the hole transporting layer also functions as the emissive layer are referred to as having a single heterostructure. Alternatively, the electroluminescent material may be present in a separate emissive layer between the hole transporting layer and the electron transporting layer in what is referred to as a double heterostructure. The separate emissive layer may contain the emissive molecule doped into a host or the emissive layer may consist essentially of the emissive molecule.

That is, in addition to emissive materials that are present as the predominant component in the charge carrier layer, that is, either in the hole transporting layer or in the electron transporting layer, and that function both as the charge carrier material as well as the emissive material, the emissive material may be present in relatively low concentrations as a dopant in the charge carrier layer. Whenever a dopant is present, the predominant material in the charge carrier layer may be referred to as a host compound or as a receiving compound. Materials that are present as host and dopant are selected so as to have a high level of energy transfer from the host to the dopant material. In addition, these materials need to be capable of producing acceptable electrical properties for the OLED. Furthermore, such host and dopant materials are preferably capable of being incorporated into the OLED using materials that can be readily incorporated into the OLED by using convenient fabrication techniques, in particular, by using vacuum-deposition techniques.

II.C.2. Exciton Blocking Layer

One can have an exciton blocking layer in OLED devices to substantially block the diffusion of excitons, thus substantially keeping the excitons within the emission layer to enhance device efficiency. The material of blocking layer is characterized by an energy difference ("band gap") between its lowest unoccupied molecular orbital (LUMO) and its highest occupied molecular orbital (HOMO) This band gap substantially prevents the diffusion of excitons through the blocking layer, yet has only a minimal effect on the turn-on voltage of a completed electroluminescent device. The band gap is thus preferably greater than the energy level of excitons produced in an emission layer, such that such excitons are not able to exist in the blocking layer. Specifically, the band gap of the blocking layer is at least as great as the difference in energy between the triplet state and the ground state of the host.

For a situation with a blocking layer between a hole-conducting host and the electron transporting layer, one seeks the following characteristics, which are listed in order of relative importance.
1. The difference in energy between the LUMO and HOMO of the blocking layer is greater than the difference in energy between the triplet and ground state singlet of the host material.
2. Triplets in the host material are not quenched by the blocking layer.
3. The ionization potential (IP) of the blocking layer is greater than the ionization potential of the host. (Meaning that holes are held in the host.)
4. The energy level of the LUMO of the blocking layer and the energy level of the LUMO of the host are sufficiently close in energy such that there is less than 50% change in the overall conductivity of the device.
5. The blocking layer is as thin as possible subject to having a thickness of the layer that is sufficient to effectively block the transport of excitons from the emissive layer into the adjacent layer.

That is, to block excitons and holes, the ionization potential of the blocking layer should be greater than that of the HTL, while the electron affinity of the blocking layer should be approximately equal to that of the ETL to allow for facile transport of electrons.

[For a situation in which the emissive ("emitting") molecule is used without a hole transporting host, the above rules for selection of the blocking layer are modified by replacement of the word "host" by "emitting molecule."]

For the complementary situation with a blocking layer between a electron-conducting host and the hole-transporting layer one seeks characteristics (listed in order of importance):

1. The difference in energy between the LUMO and HOMO of the blocking layer is greater than the difference in energy between the triplet and ground state singlet of the host material.
2. Triplets in the host material are not quenched by the blocking layer.
3. The energy of the LUMO of the blocking layer is greater than the energy of the LUMO of the (electron-transporting) host. (Meaning that electrons are held in the host.)
4. The ionization potential of the blocking layer and the ionization potential of the host are such that holes are readily injected from the blocker into the host and there is less than a 50% change in the overall conductivity of the device.
5. The blocking layer is as thin as possible subject to having a thickness of the layer that is sufficient to effectively block the transport of excitons from the emissive layer into the adjacent layer.

[For a situation in which the emissive ("emitting") molecule is used without an electron transporting host, the above rules for selection of the blocking layer are modified by replacement of the word "host" by "emitting molecule."]

II.D. Color

As to colors, it is desirable for OLEDs to be fabricated using materials that provide electroluminescent emission in a relatively narrow band centered near selected spectral regions, which correspond to one of the three primary colors, red, green and blue so that they may be used as a colored layer in an OLED or SOLED. It is also desirable that such compounds be capable of being readily deposited as a thin layer using vacuum deposition techniques so that they may be readily incorporated into an OLED that is prepared entirely from vacuum-deposited organic materials.

U.S. 08/774,087 filed Dec. 23, 1996, now U.S. Pat. No. 6,048,630, is directed to OLEDs containing emitting compounds that produce a saturated red emission.

III. SUMMARY OF THE INVENTION

At the most general level, the present invention is directed to organic light emitting devices comprising an electron transporting layer comprising derivatives of cyclooctatetraene ("COTs") and an emissive layer wherein the emissive layer comprises an emissive molecule, which molecule is adapted to luminesce when a voltage is applied across a heterostructure. The COTs represent a new class of wide gap electron transporters that are readily deposited in vacuum. They an be synthesized in good yield (>75% isolated yields) from commercially available starting materials.

In a first embodiment, a member of the class of cyclooctatetraenes is used to form an electron transporting layer in an OLED wherein the hole transporting layer comprises the emissive molecule of the device.

In a second embodiment, a member of the class of cyclooctatetraenes is used to form an electron transporting layer in an OLED to enhance the emission of a molecule in the hole transporting layer.

IV. BRIEF DESCRIPTION OF THE DRAWINGS

FIG. 1. OLED structure.

Figure 2A:
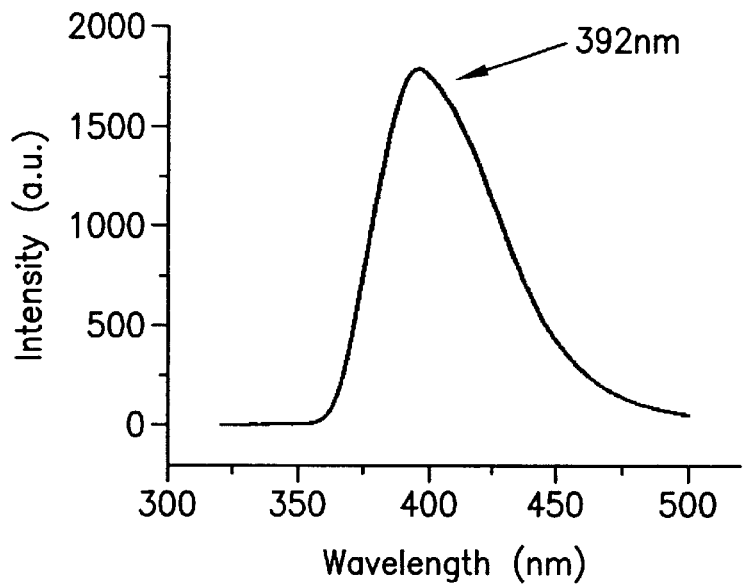
Figure 2A:
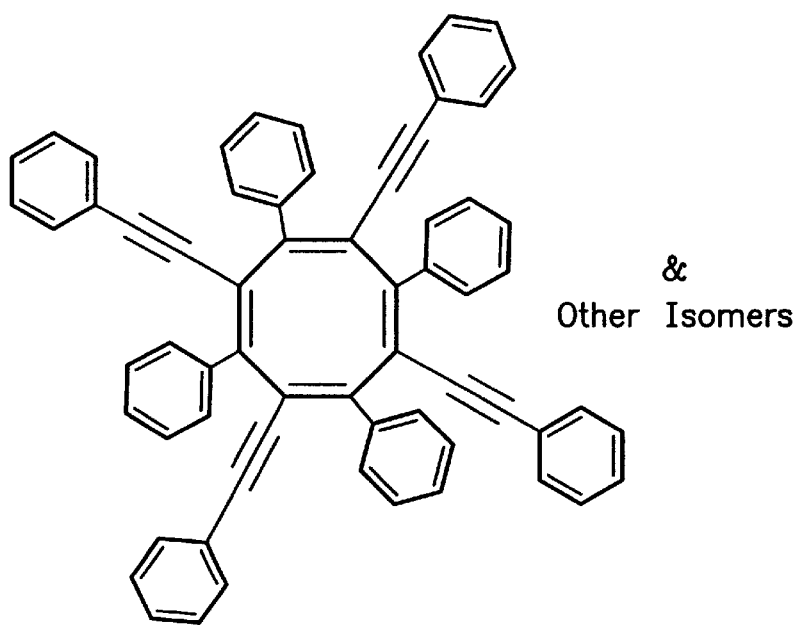
Figure 2B:
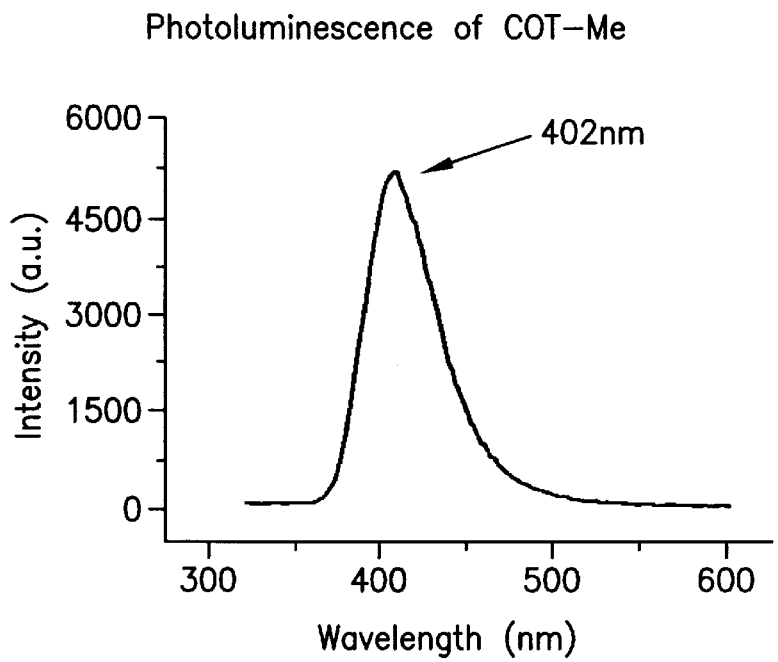
Figure 2B:
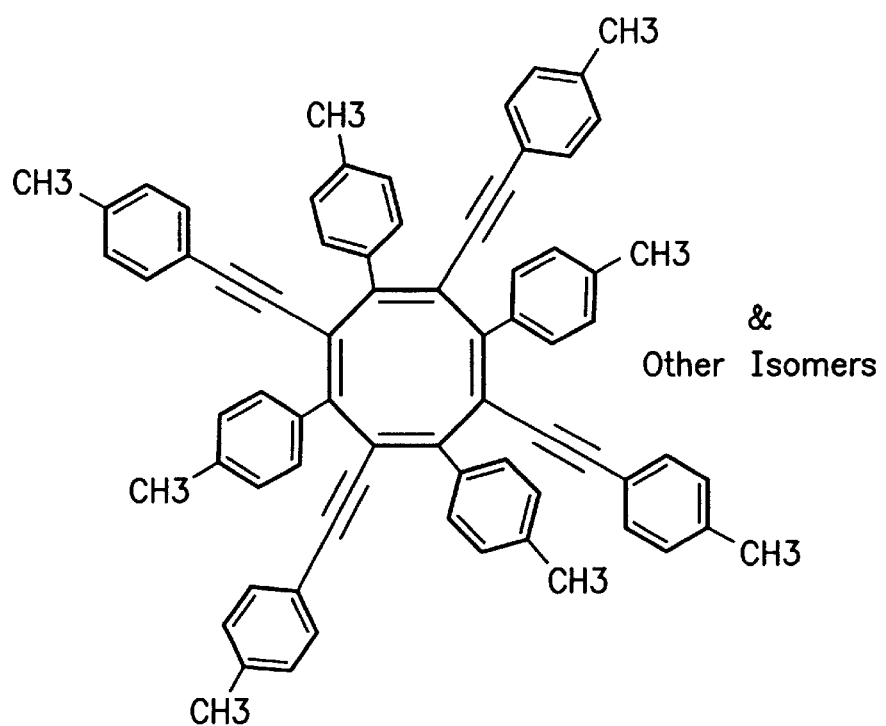

FIGS. 2(a) and 2(b). Structure of COT derivatives and their luminescent spectra.

Figure 3:
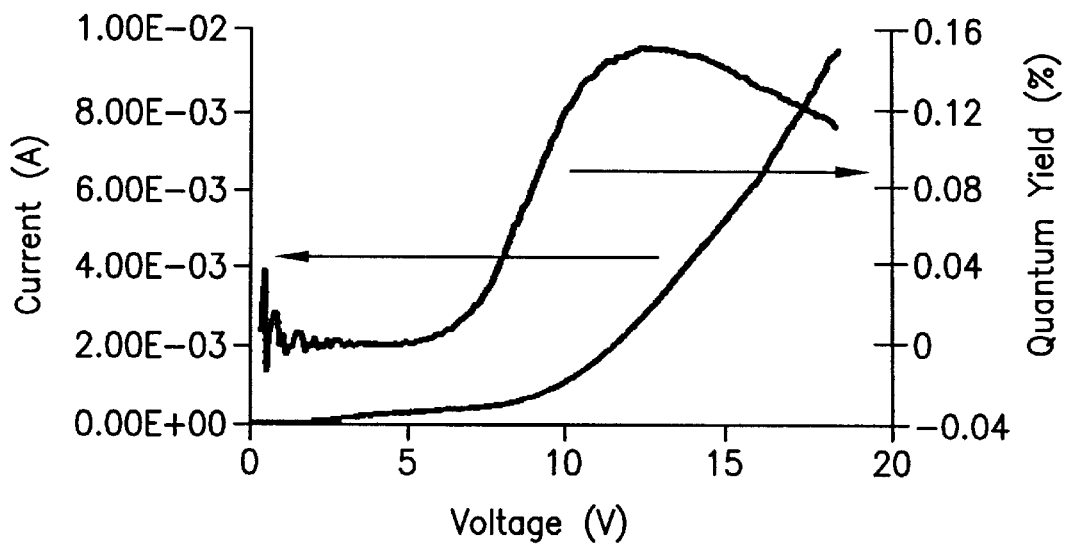
Figure 3:
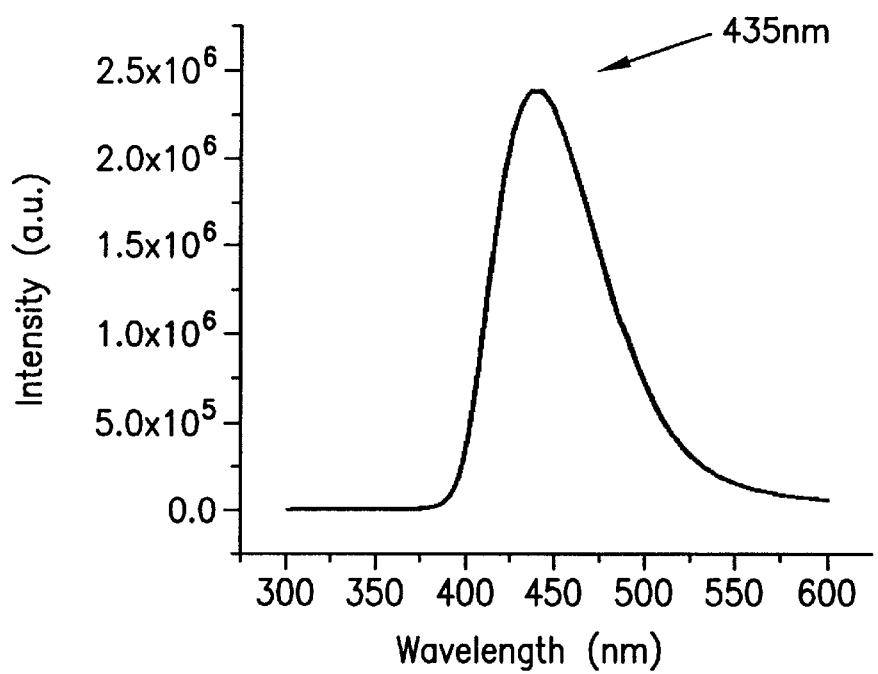
Figure 4:
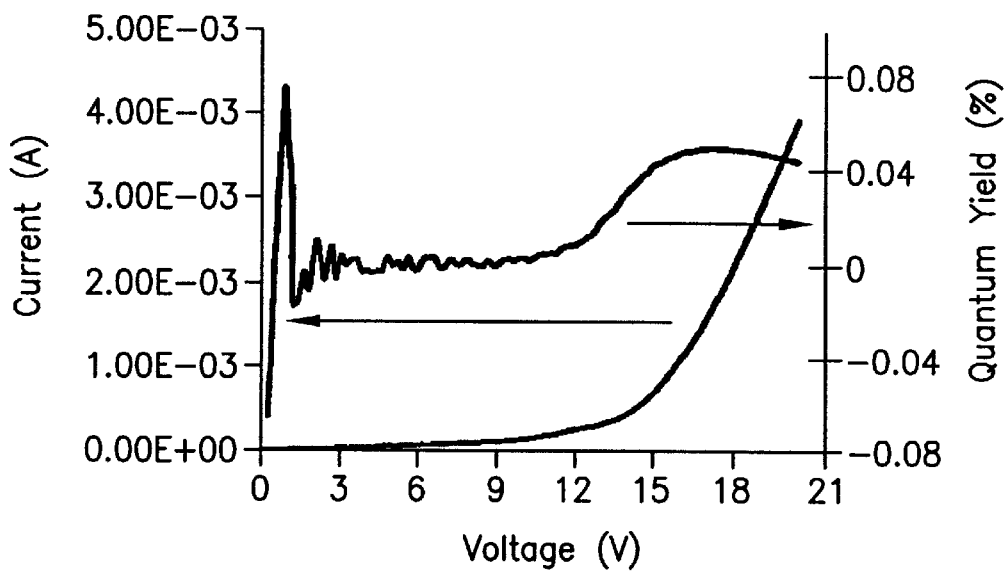
Figure 4:
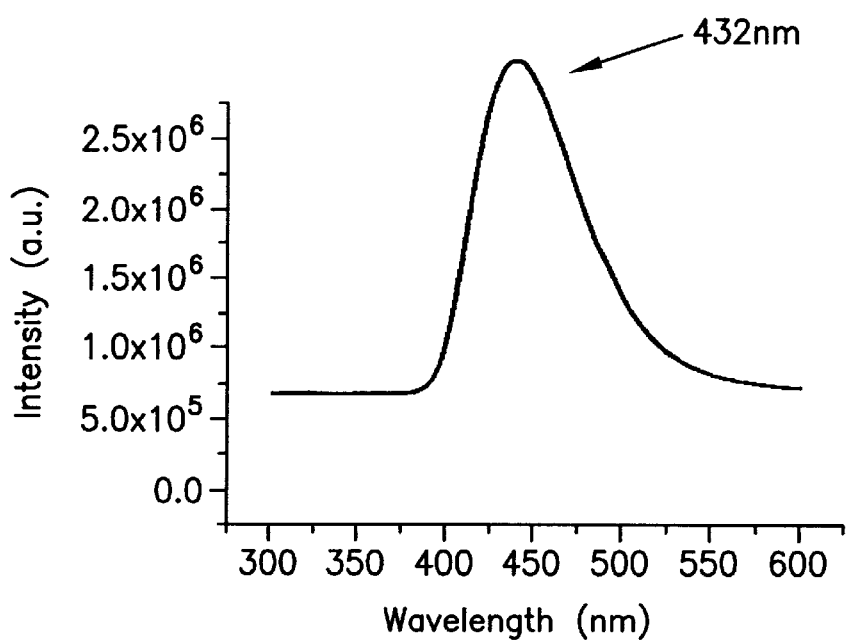

FIG. 3. IV characteristics, Q.E./V and EL spectra of OLED fabricated with a 400 Å COT-Me layer. FIG. 4. IV characteristics, Q.E./V and EL spectra of OLED fabricated with a 400 Å COT-H layer.

Figure 5:
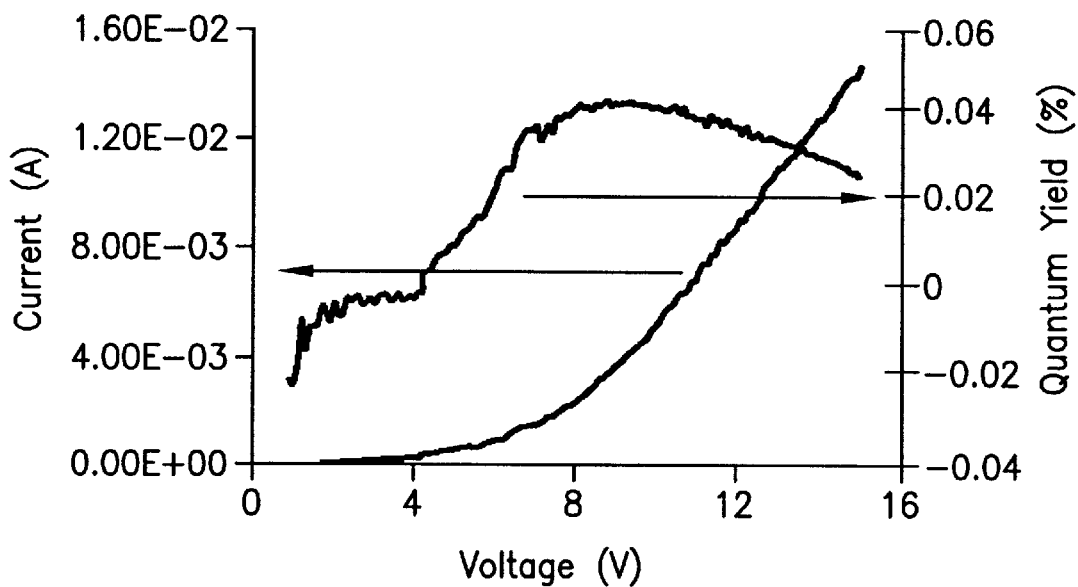
Figure 5:
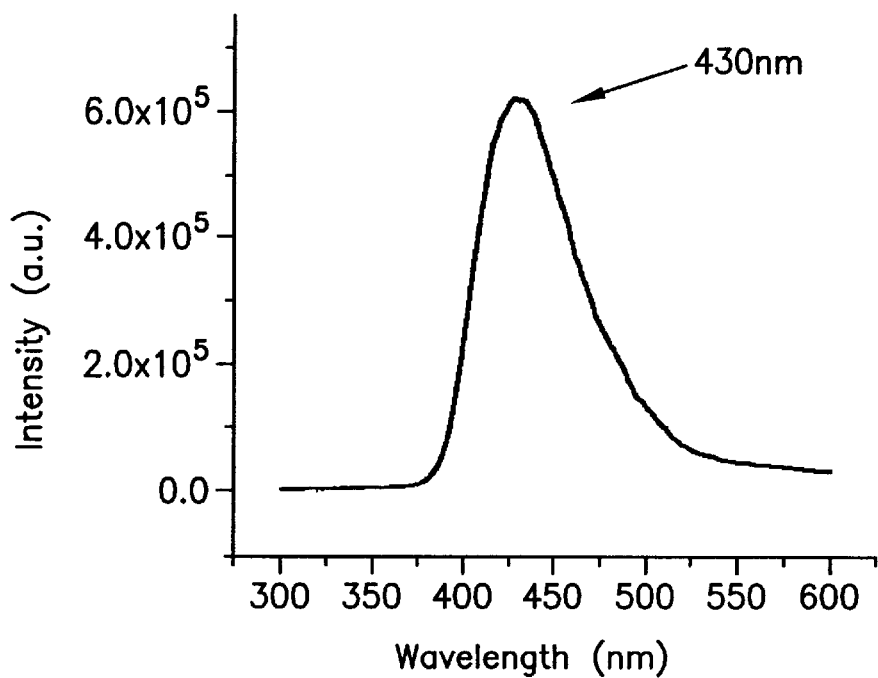

FIG. 5. IV characteristics Q.E./V and EL spectra of OLED fabricated with a 200 Å COT-Me layer.

Figure 6:
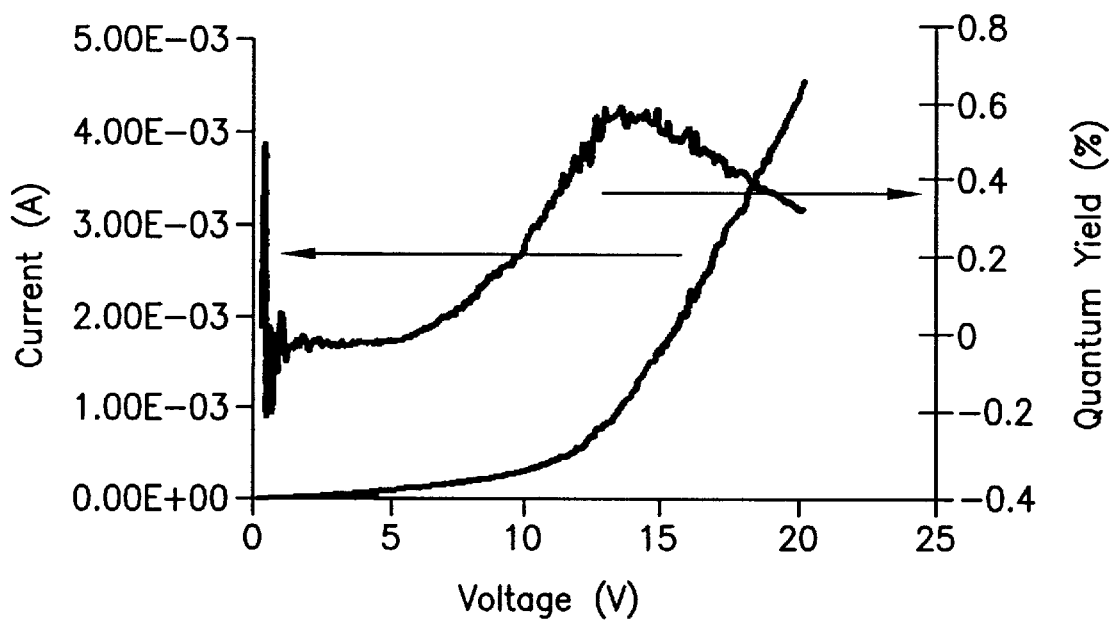
Figure 6:
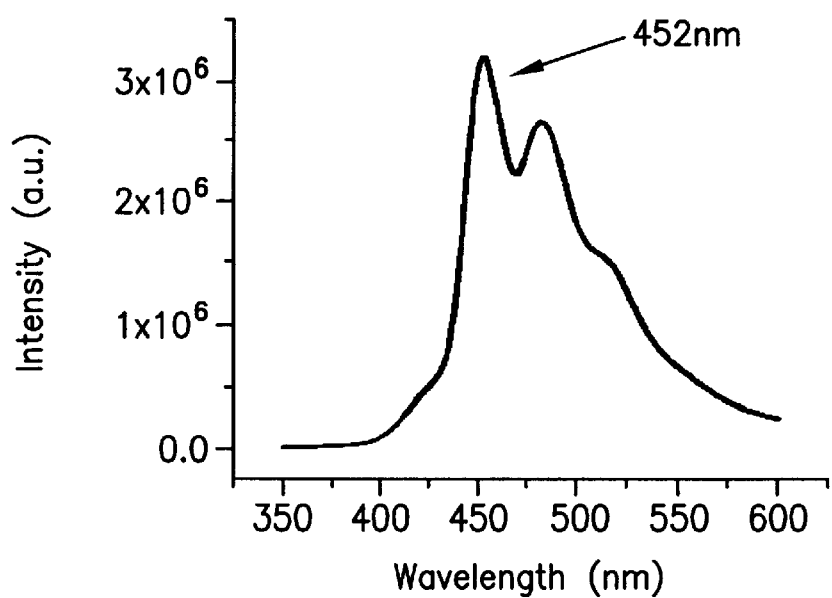

FIG. 6. IV characteristics Q.E./V and EL spectra of OLED fabricated with 1% perylene doped into the NPD layer followed by a 400 Å COT-Me layer.

Figure 7:
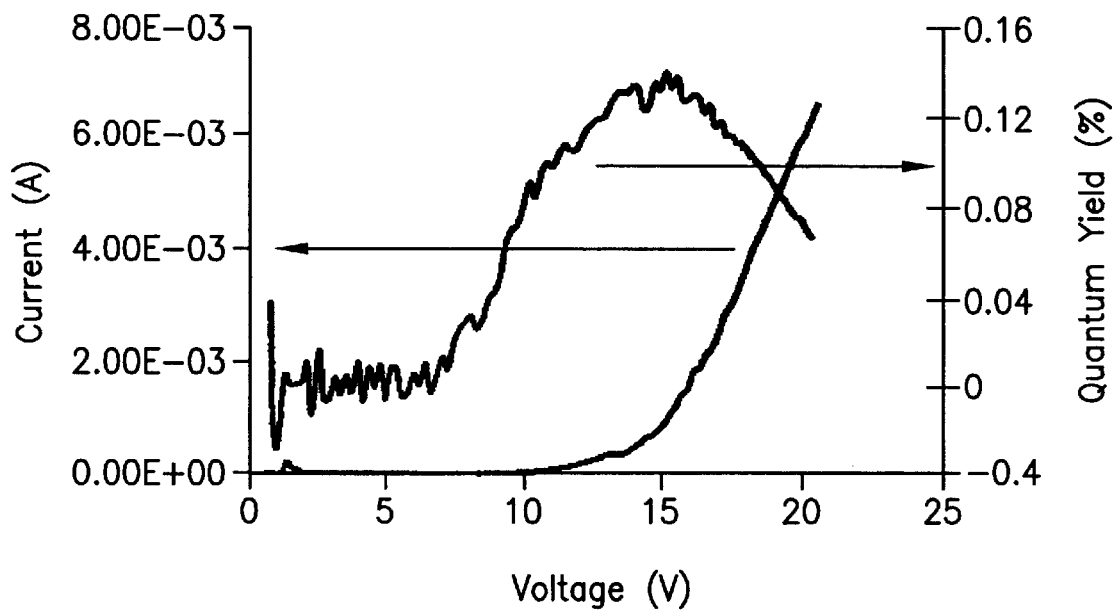
Figure 7:
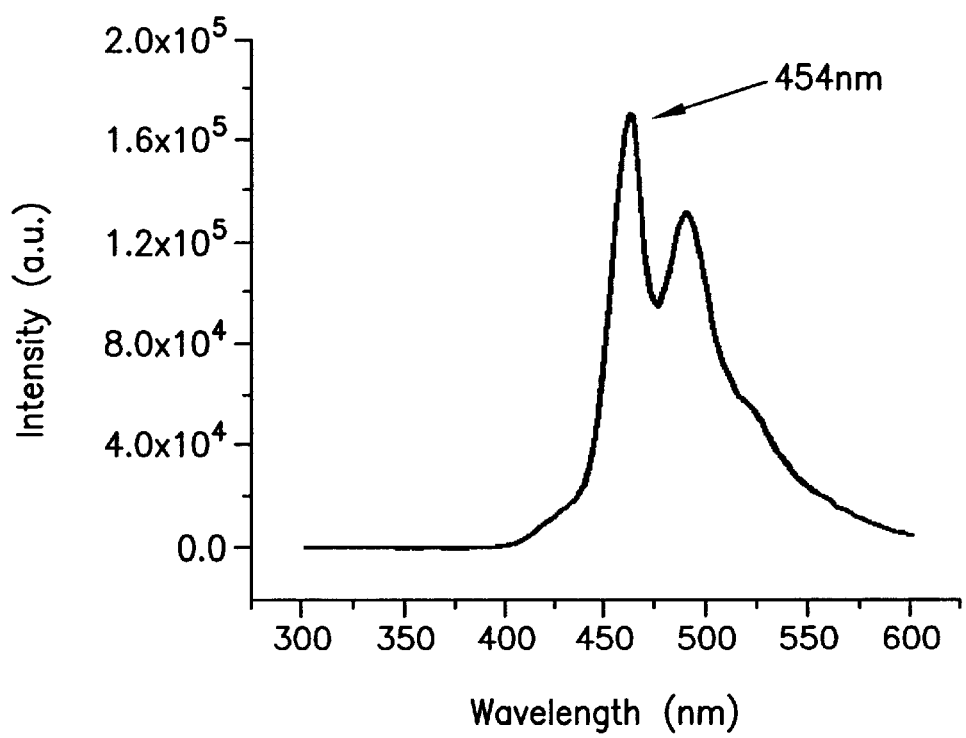

FIG. 7. IV characteristics Q.E./V and EL spectra of OLED fabricated with 1% perylene doped into the NPD layer followed by a 400 Å COT-H layer.

Figure 8:
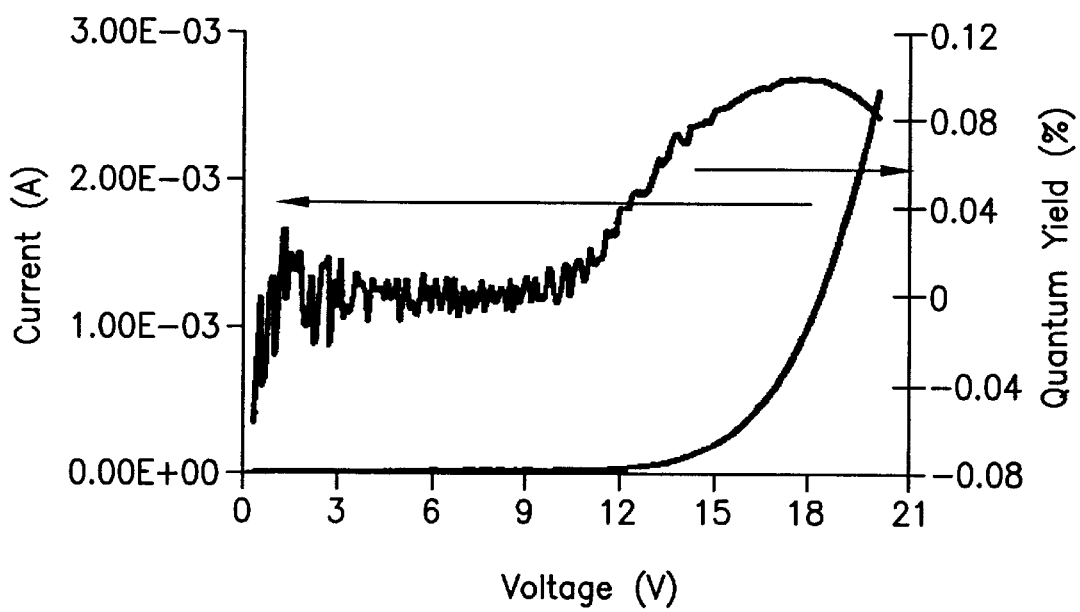
Figure 8:
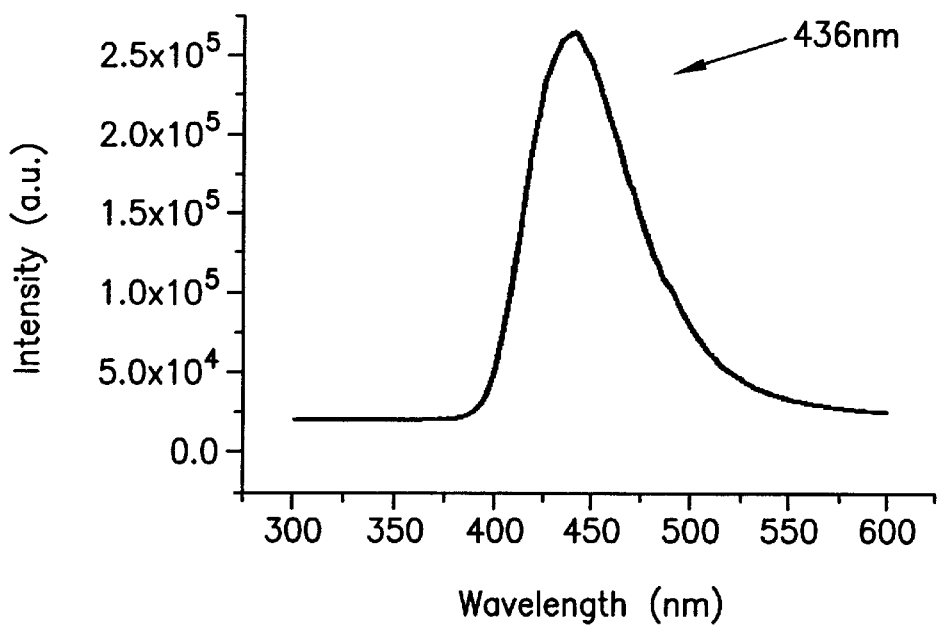

FIG. 8. IV characteristics Q.E./V and EL spectra of OLED with a 400 Å NPD layer and with 1% perylene doped into the NPD layer followed by a 400 Å COT-H layer.

Figure 9:
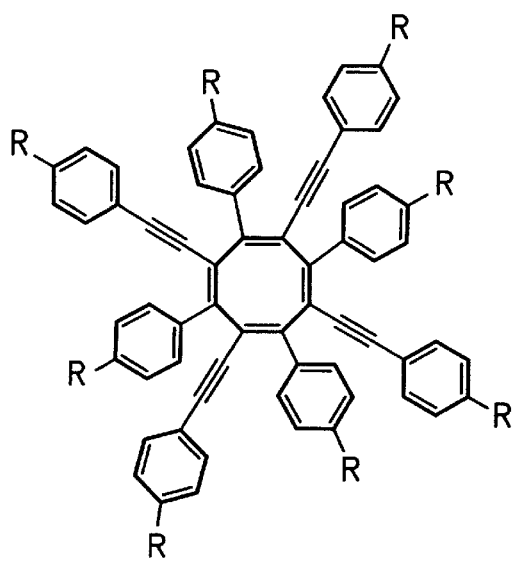
Figure 9:
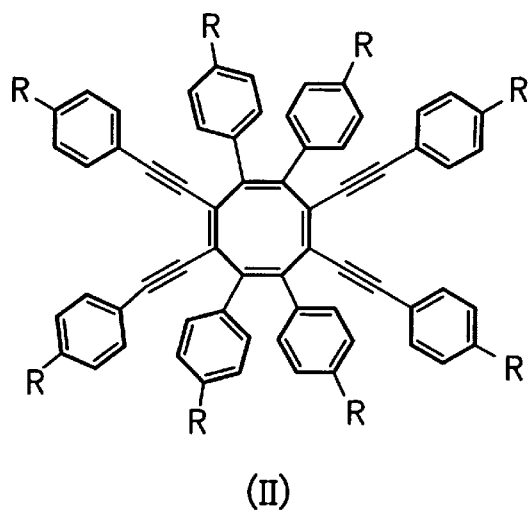
Figure 9:
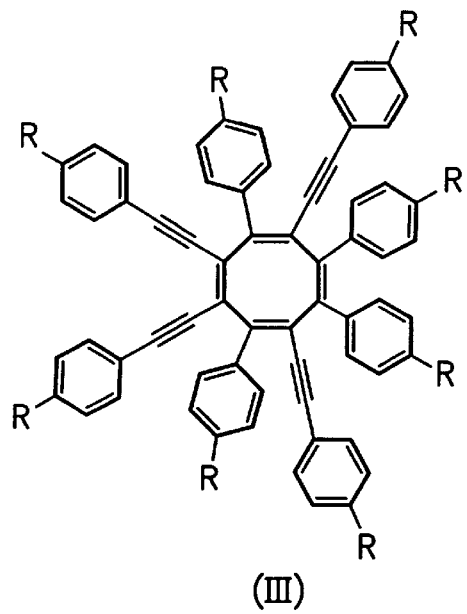
Figure 9:
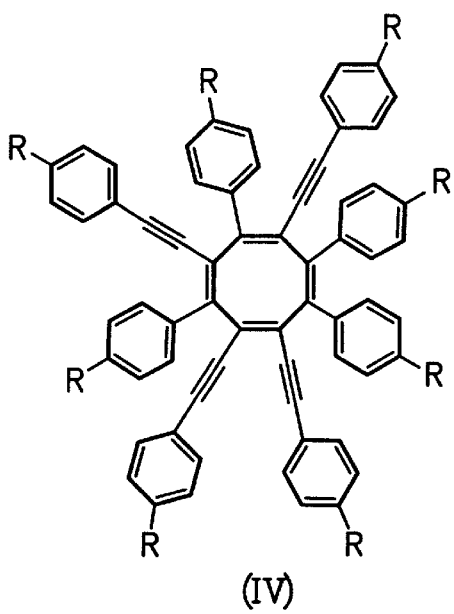

FIG. 9. General depiction of four possible isomeric cyclooctatetraenes which can be formed from the starting butadiyne if the ligands and other carbons of the starting butadiyne maintain their initial connectivity with no structural rearrangement. Isomer IV has neither a mirror plane nor a center of symmetry. NMR arguments suggest that the ruthenium catalyzed reaction discussed herein can yield isomer IV.

Figure 10:
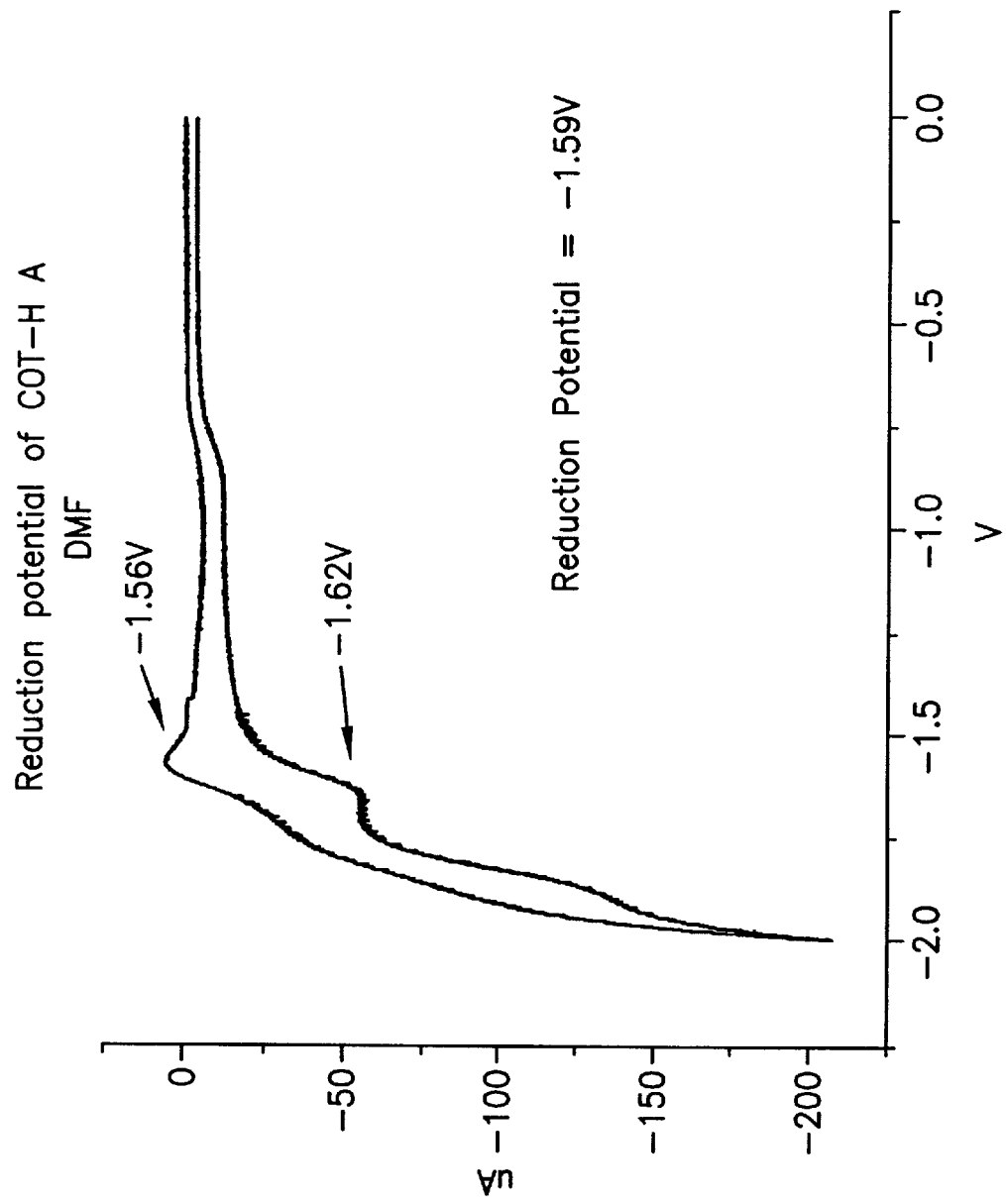

FIG. 10. Cyclic voltammetry on COT-H. (Reduction potential=−1.59 V v. SCE).

Figure 11:
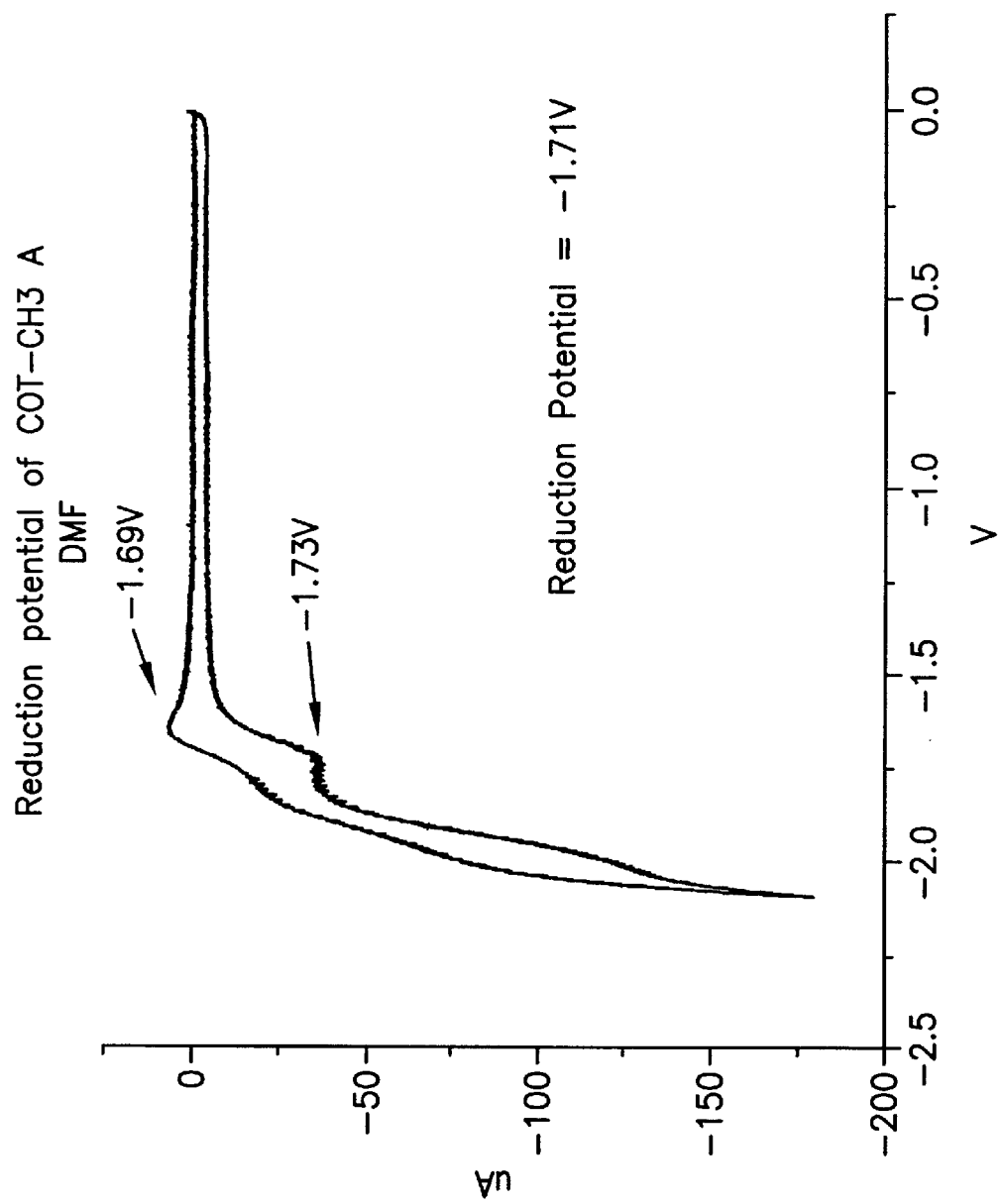

FIG. 11. Cyclic voltammetry on COT-CH3. (Reduction potential=−1.71 V v. SCE).

Figure 12:
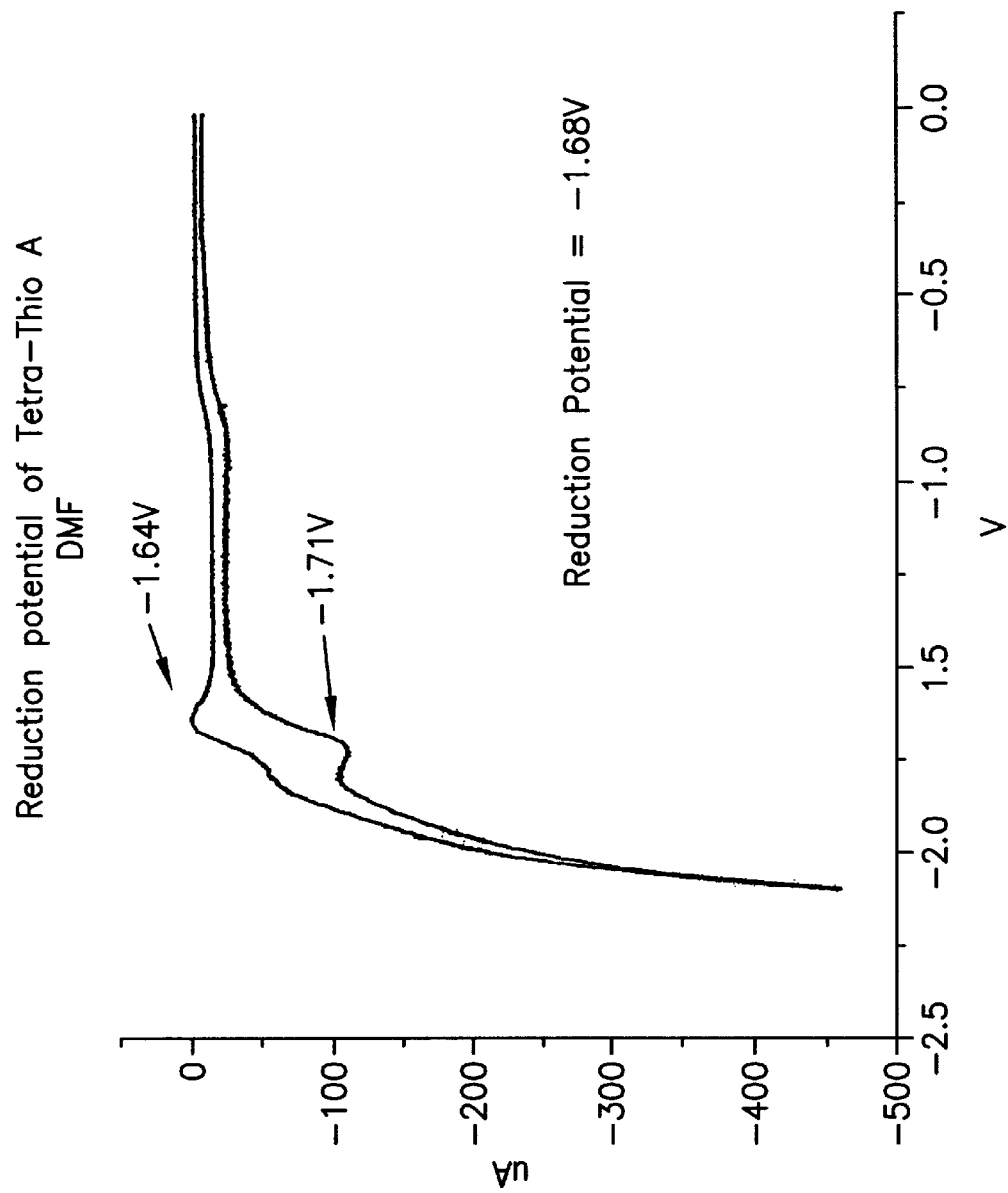

FIG. 12. Cyclic voltammetry on tetra thienyl derivative (COT-S). (Reduction potential=−1.68 V v. SCE)

Figure 13:
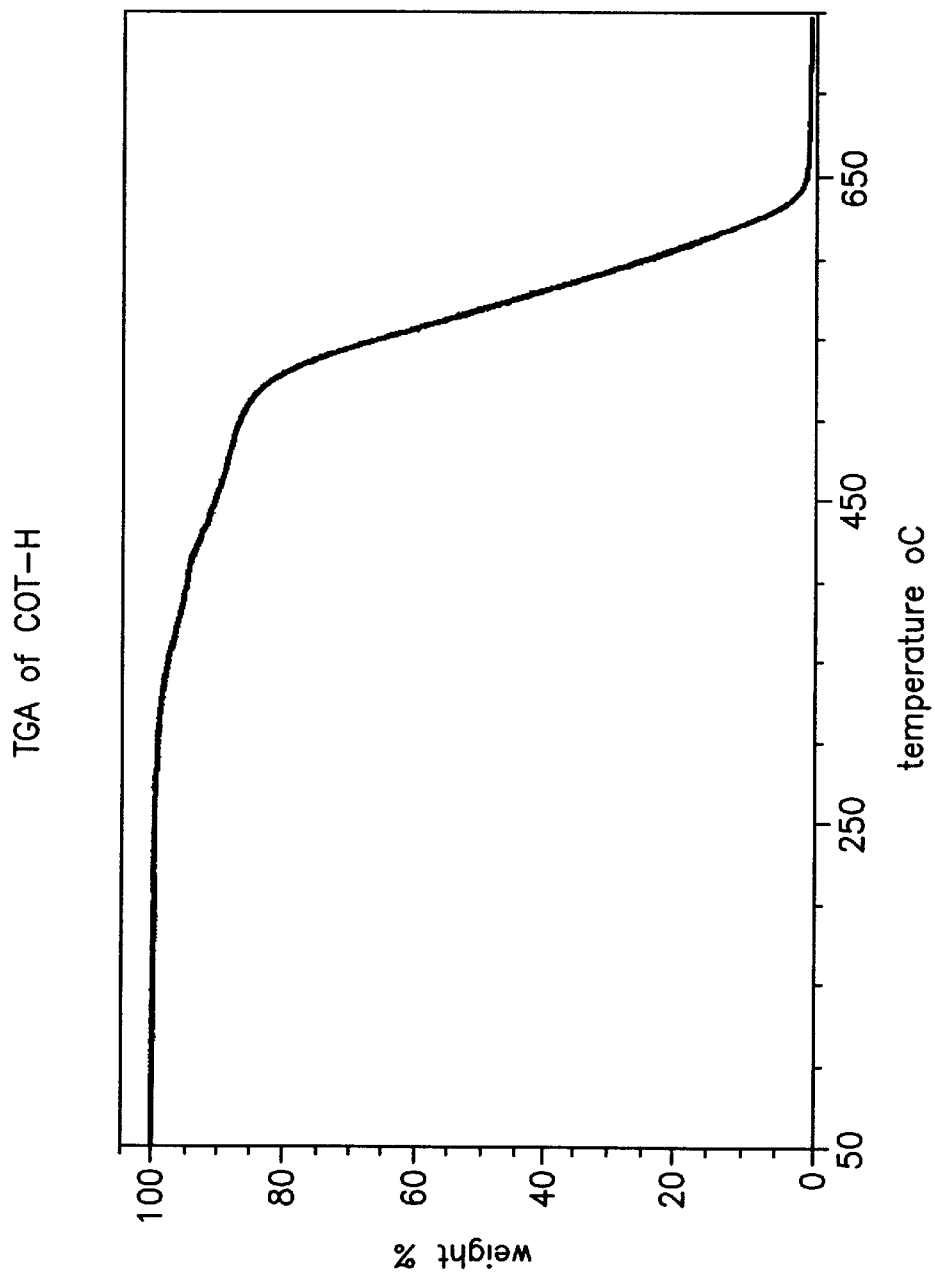

FIG. 13. Thermogravimetric analysis ("TGA") of COT-H.

Figure 14:
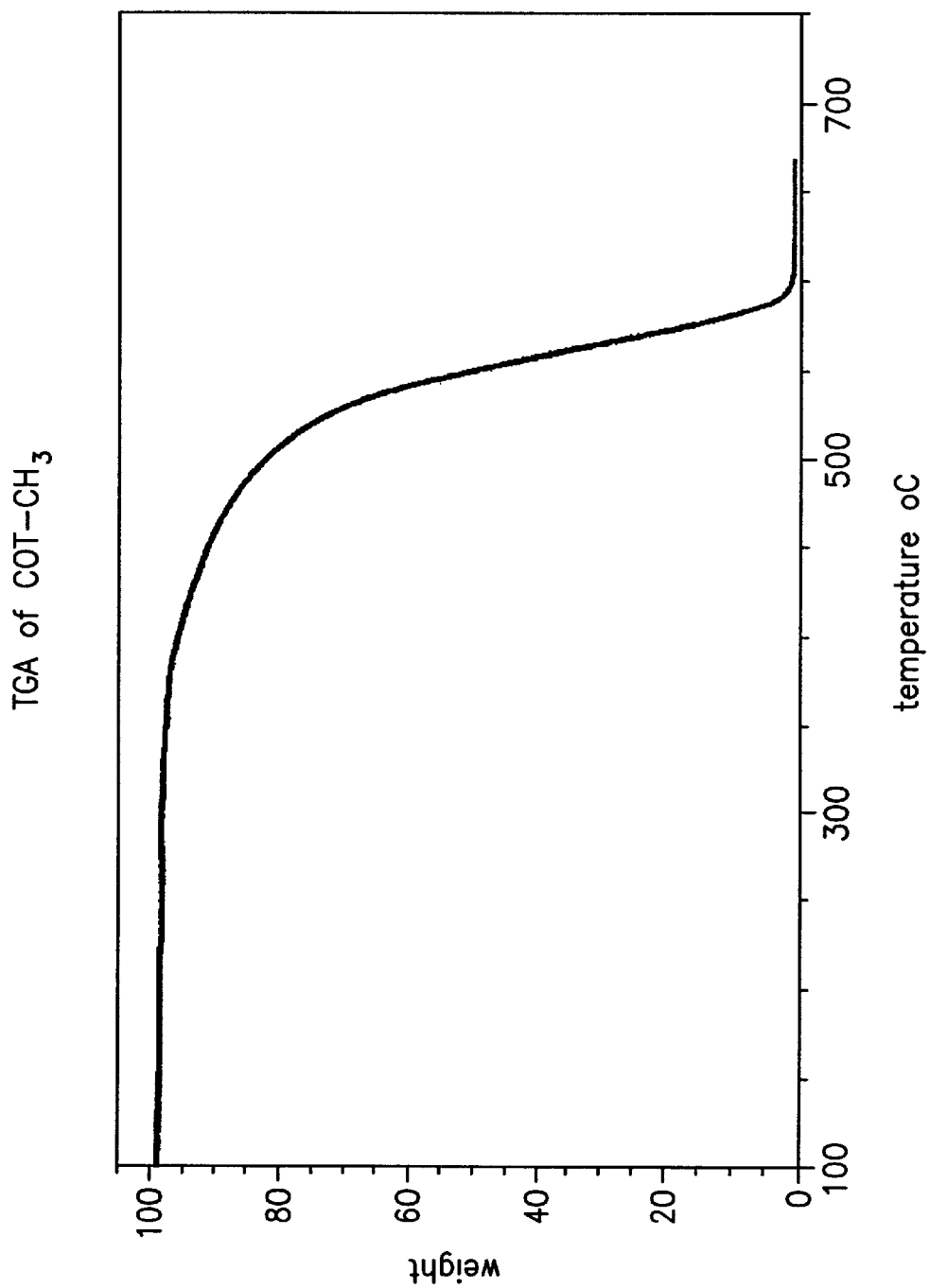

FIG. 14. Thermogravimetric analysis ("TGA") of COT-CH3.

Figure 15:
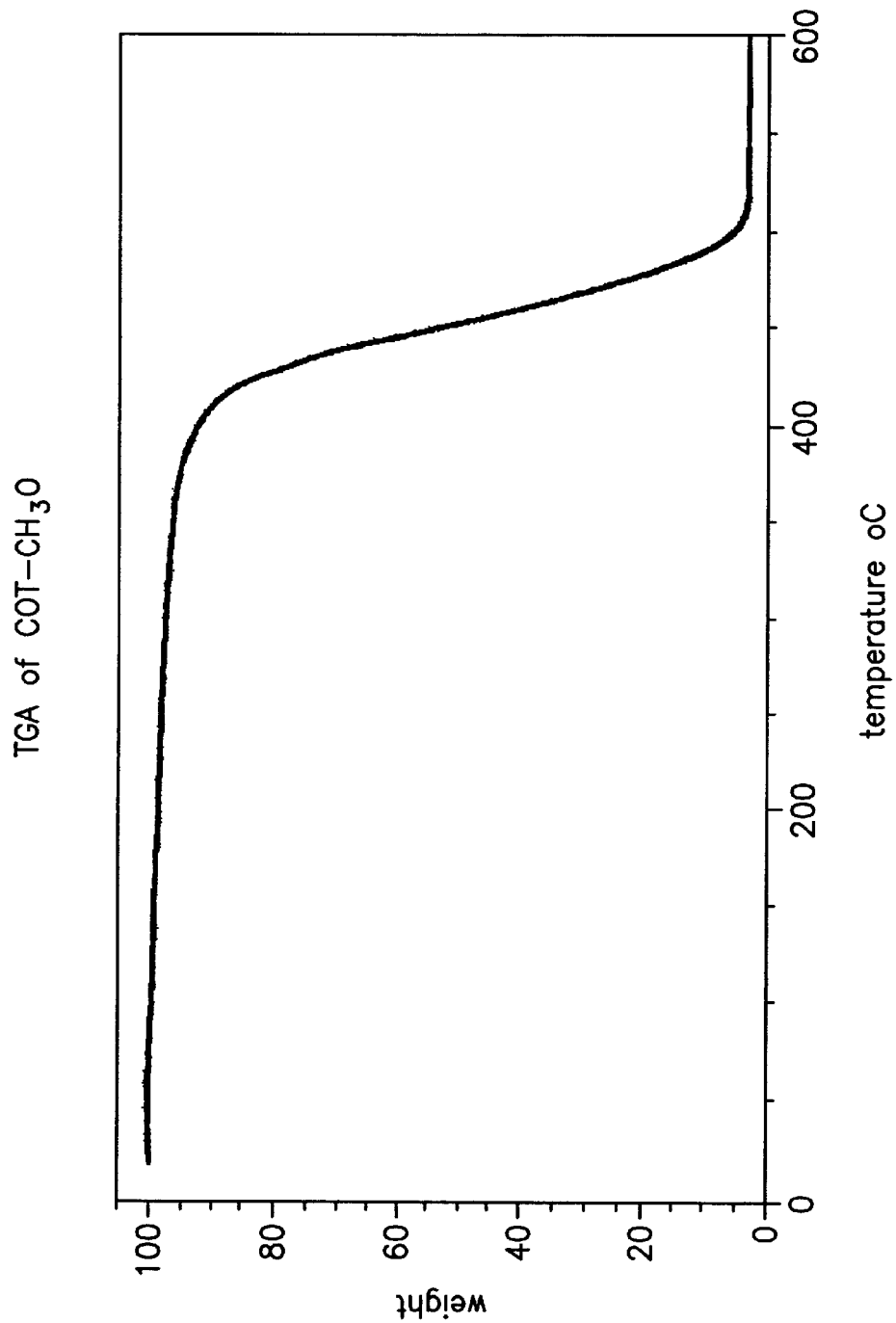

FIG. 15. Thermogravimetric analysis ("TGA") of COT-CH3O

Figure 16:
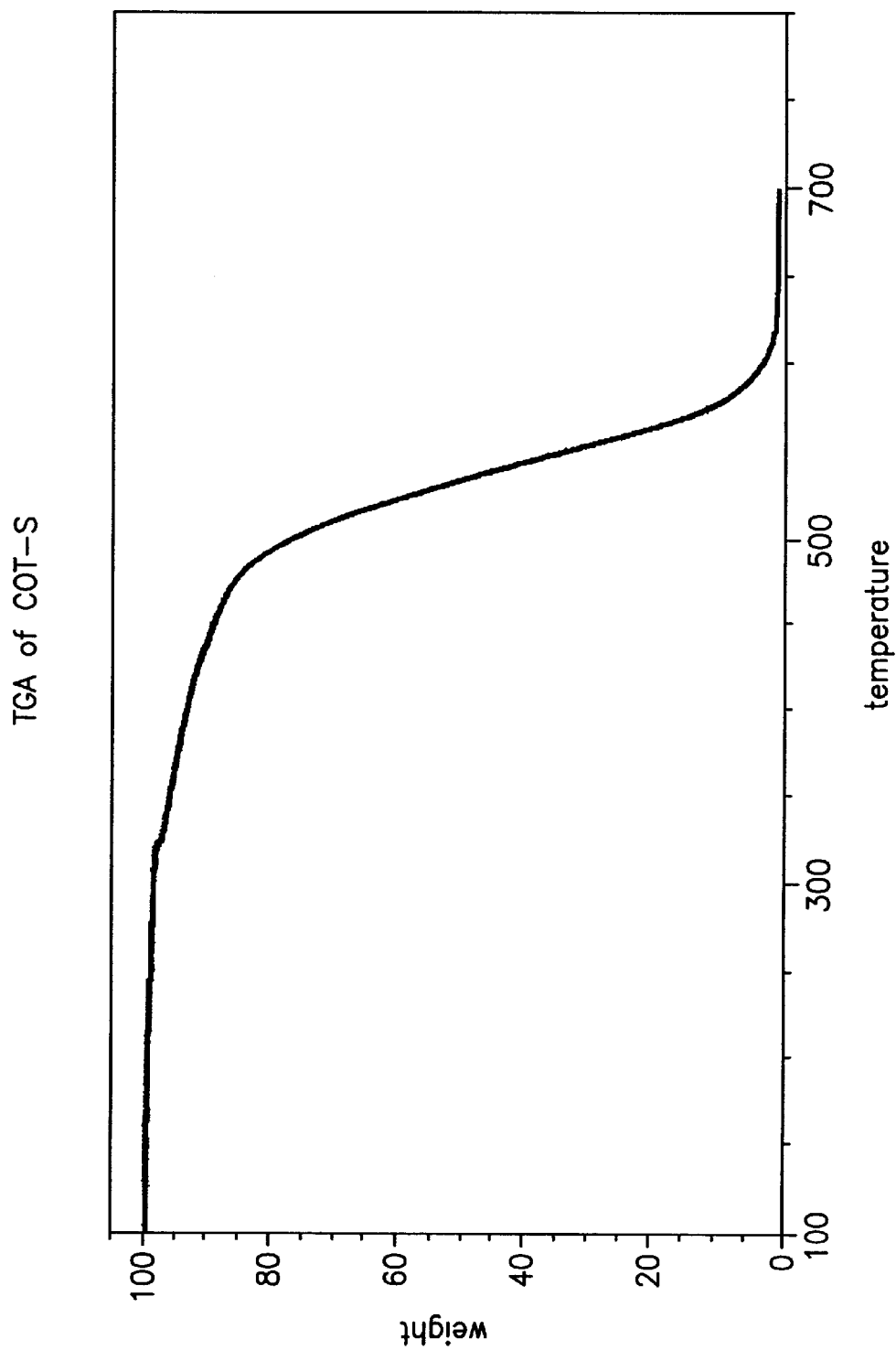

FIG. 16. Thermogravimetric analysis ("TGA") of COT-S.

Figure 17:
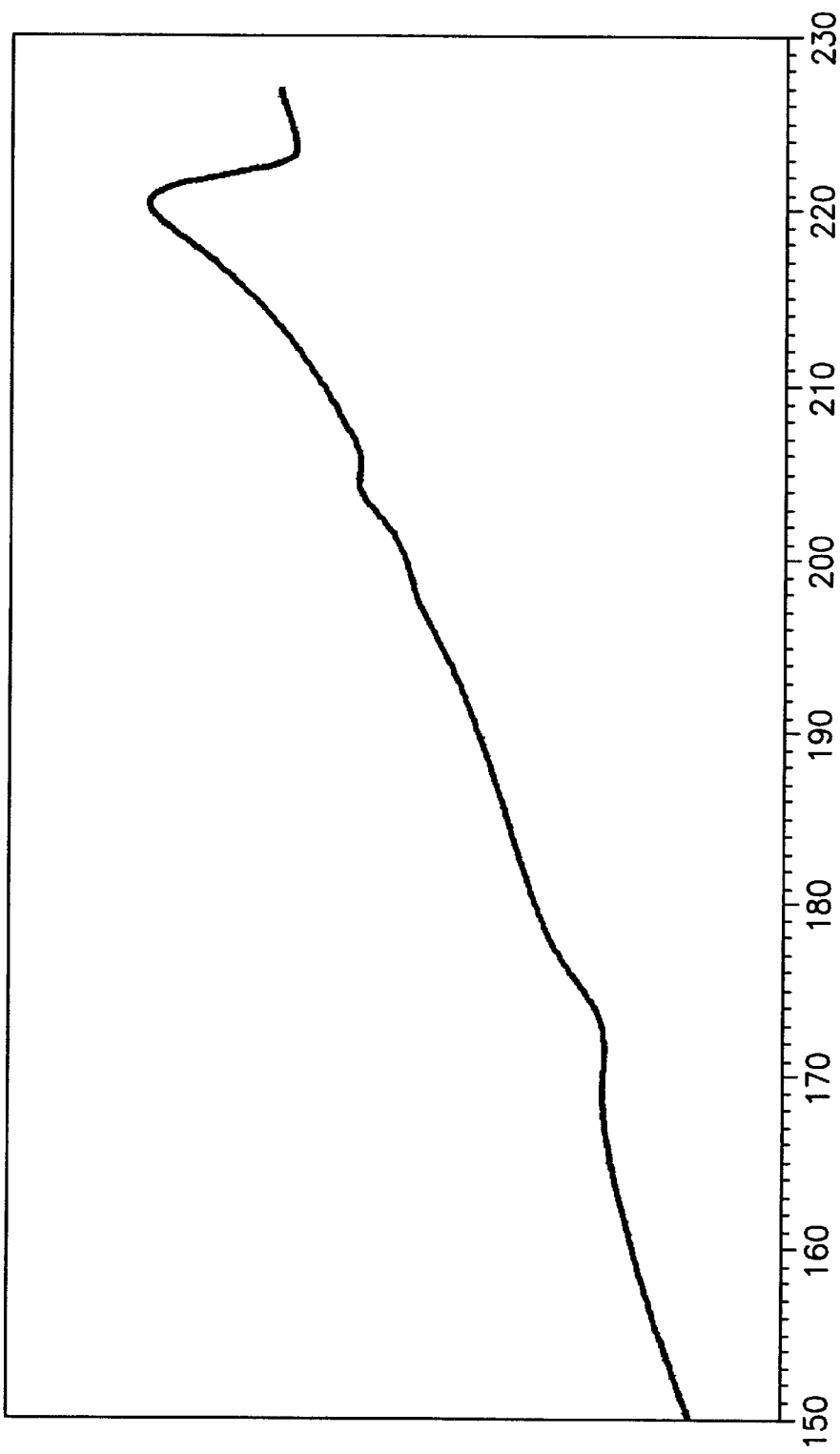

FIG. 17. Differential scanning calorimetry ("DSC") of COT-H giving glass transition (Tg) and melting point (Tm)

Figure 18:
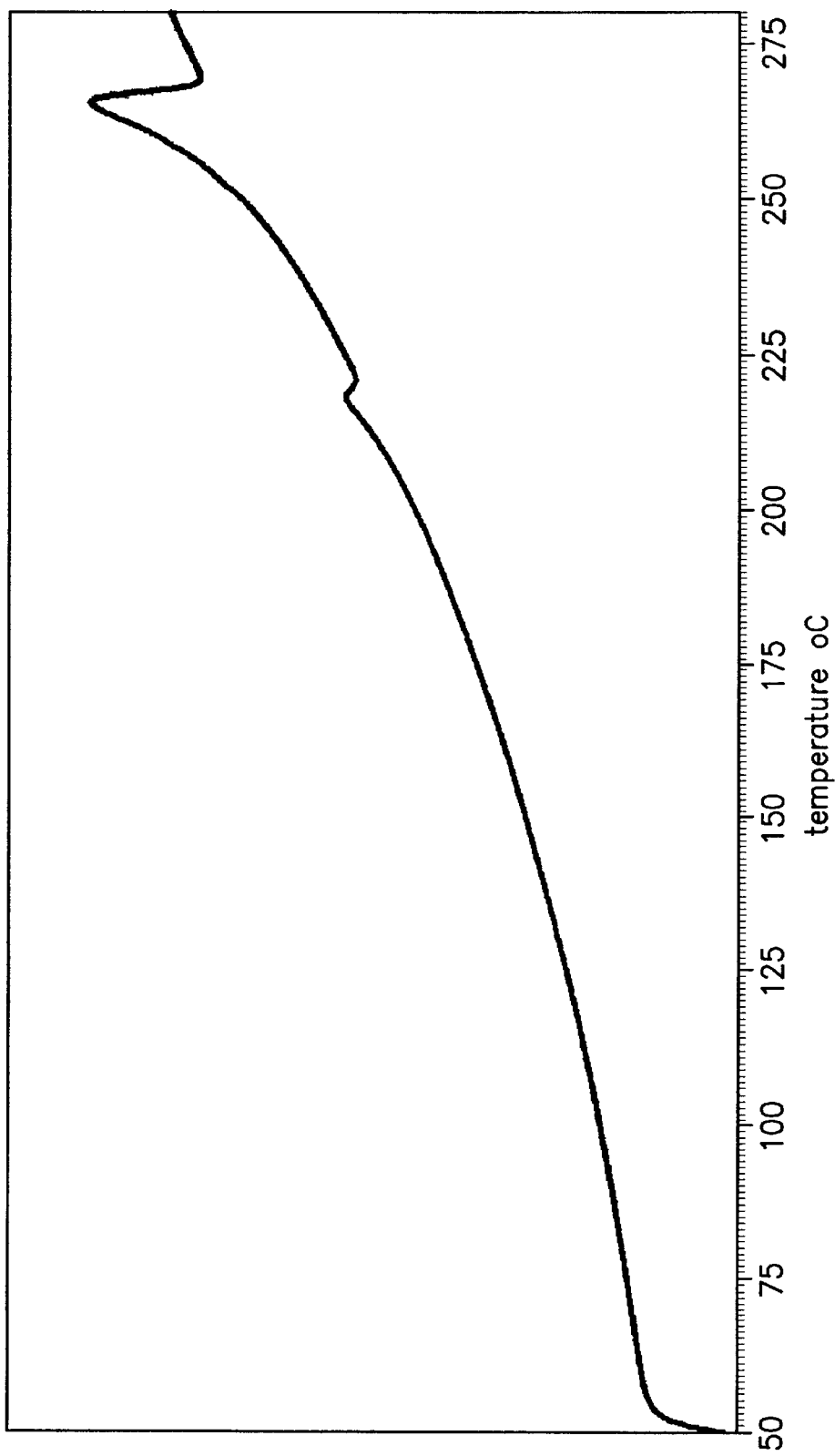

FIG. 18. Differential scanning calorimetry ("DSC") of COT-CH3 giving glass transition (Tg) and melting point (Tm)

Figure 19:
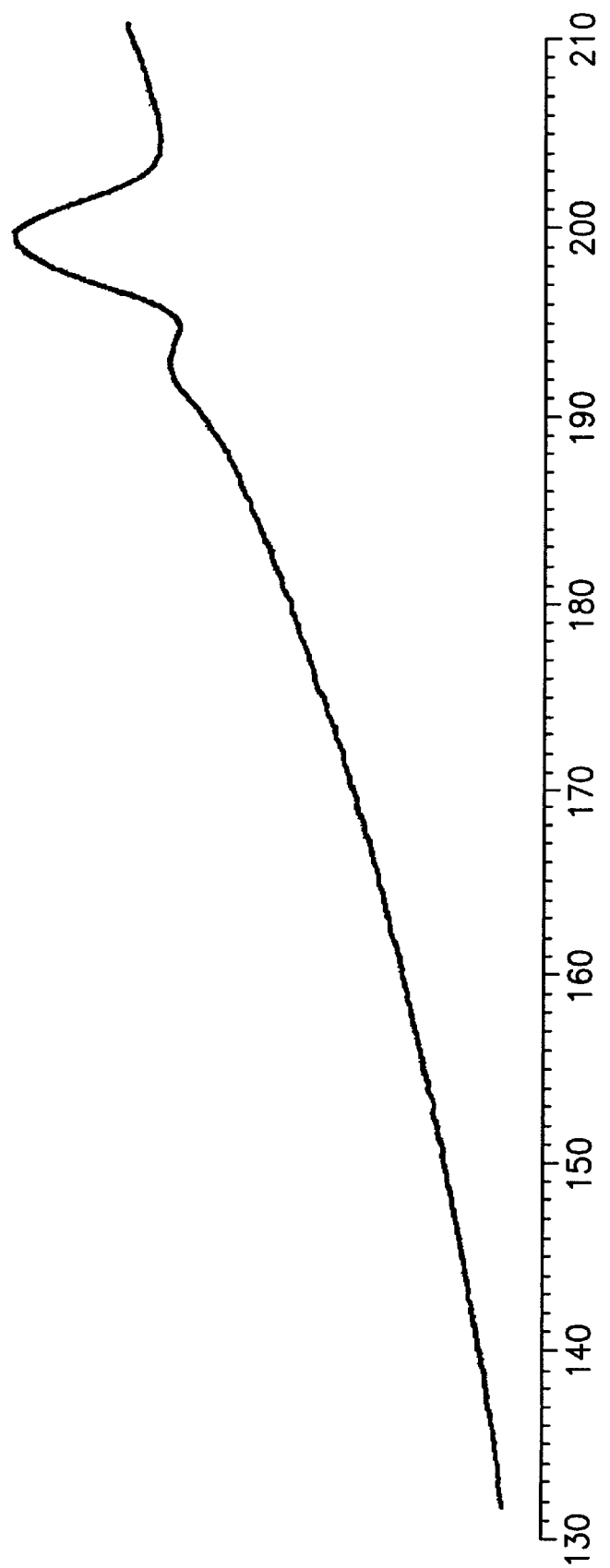

FIG. 19. Differential scanning calorimetry ("DSC") of COT-CH3O giving glass transition (Tg) and melting point (Tm)

V. DETAILED DESCRIPTION OF THE INVENTION

The present invention is directed to organic light emitting devices (OLEDs) comprising electron transporting layers (ETLs) comprising derivatives of cyclooctatetraene. These include OLEDs wherein the hole transporting layer (HTL) comprises the emissive molecules and these include OLEDs wherein there is a separate emissive layer.

As to terminology, The term "organometallic" is as generally understood by one of ordinary skill, as given, for example, in "Inorganic Chemistry" (2nd edition) by Gary L. Miessler and Donald A. Tarr, Prentice-Hall (1998). Discussions of the appearance of color, including descriptions of CIE charts, may be found in Color Chemistry, VCH Publishers, 1991 and H. J. A. Dartnall, J. K. Bowmaker, and J. D. Mollon, Proc. Roy. Soc. B (London), 1983, 220, 115–130.

The present invention will now be described in detail for specific preferred embodiments of the invention, it being understood that these embodiments are intended only as illustrative examples and the invention is not to be limited thereto.

V.A.1. Device Preparation

The device structure that we chose to use is very similar to the standard vacuum deposited one (FIG. 1). A hole transporting layer ("HTL") is first deposited onto the ITO coated glass substrate. For all of the devices described here, the HTL consisted of 400 Å of NPD. Onto the NPD a thin film of the cyclooctatetraene derivative is deposited. Two different derivatives ("COTS") were examined (FIG. 2), each at two different film thicknesses (which were 400 and 200 Å). The device is finished by depositing a Mg—Ag electrode onto the COT film. All of the depositions were carried out at a vacuum less than 5×10–5 Torr. The devices were tested in air, without packaging.

COTs themselves have high fluorescence yields and might be suitable as blue emitting host materials (FIG. 2). However, in the embodiments discussed below, the NPD is functioning as the emissive molecule.

V.A.2. First Example

The OLED of the first device comprises an ETL comprising COT-Me. The molecular formula of COT-Me is as follows.

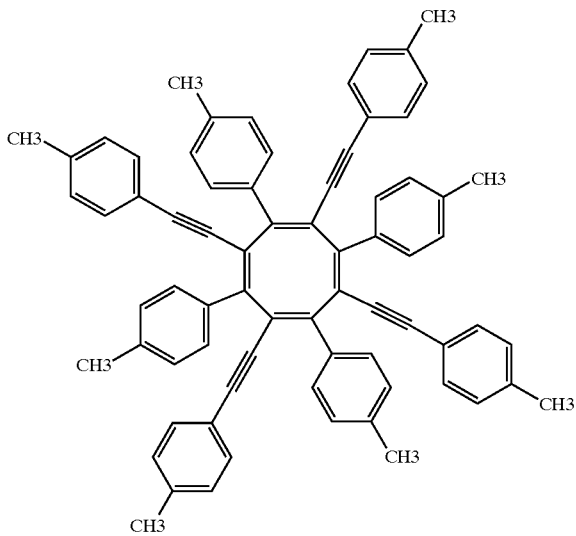

Chemical Structure of COT-Me

The standard undoped device gives an IV characteristic (FIG. 3) that is very similar to an analogous device made with an electron transporting layer of Alq3 with a blue emitter.

The spectra of the OLED of the first example are consistent with emission from the NPD of the hole transporting layer, and are not consistent with emission from the COT-Me of the electron transporting layer. The EL spectrum is identical to the photoluminescence and electroluminescence spectra of NPD.

This result is not surprising since the energy of an exciton in COT-Me wold be greater than that of one in NPD. The excitons are formed at or near the NPD/COT-Me interface and are trapped in the lower energy NPD layer.

V.A.3. Second Example

A similar result is observed for an OLED comprising an ETL comprising COT-H. The molecular formula of COT-H is as follows.

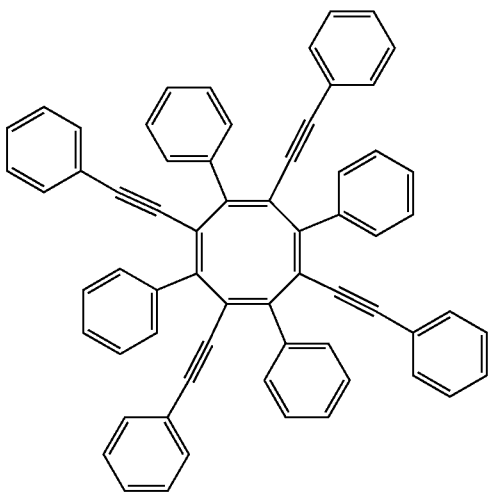

Chemical Structure of COT-H

In FIG. 4, the IV curve is shifted to somewhat higher bias, but the emission is exclusively from the NPD layer.

The quantum yields for the COT-Me and COT-H are 0.15 and 0.05 respectively. These efficiencies are consistent with other devices wherein a blocking layer is added to force emission from the NPD layer. If the COT layer is thinned down, the current-voltage characteristic shifts to lower bias at a given current level (FIG. 5); however, the quantum yield for the device drops. The exact layer thickness for the best quantum efficiency and lowest turn-on voltage could be optimized without undue experimentation.

V.A.4. Third and Fourth Examples

To confirm that the NPD is the site of the emission, another device was fabricated with a perylene dopant in the NPD layer. The shift in energy relative to the photoluminescence spectra of the COT derivative could have been due to microcavity effects. The perylene will efficiently trap excitons in NPD and will emit with a distinctly different spectrum. If microcavity effects are responsible for the emission at 435 nm, the perylene doping will have little effect on the EL spectrum.

The EL spectra for perylene-doped NPD devices prepared with both COT-Me (Example 3) and COT-H (Example 4) are shown in FIGS. 6 and 7 respectively.

Each spectrum is clearly due to perylene, confirming that the site of the emission is in the NPD. As expected, the doping leads to an increase in the measured quantum yields to 0.6 (for COT-Me OLED) and to 0.14 (for COT-H OLED). The IV characteristics of these devices are unchanged relative to the undoped devices.

V.A.5. Fifth Example

As a double check of the proposal that the emission is completely centered in the NPD layer, we prepared a device with perylene doped into the COT-Me layer. The COT-Me doped device was 400 Å of NPD and 400 Å of 1% perylene doped COT-Me. The current-voltage curve and EL spectra are shown in FIG. 8. The emission is exactly the same as the for the undoped device, with roughly the same quantum efficiency, i.e., pure NPD emission, demonstrating that excitons have been confined to the HTL layer.

Results of Examples 1–5

The use of the materials of this invention may make it possible to eliminate the hole and/or exciton blocking layer used to prepare HTL emitting OLEDs. The COTs represent a new class of wide gap electron transporters that are readily deposited in vacuum. They can be synthesized in good yield (>75% isolated yields) from commercially available starting materials.

We are studying a range of cathode materials to see if Mg is necessary or if other less reactive metals can used for the novel COT materials. We are also exploring the use of the material with phosphorescent dye doped HTL for green and red OLEDs.

V.L. Synthetic Work

V.B.1. Overview of Results

The present invention is directed to the synthesis of certain cyclooctatetraene derivatives and to organic light emitting devices (OLEDs) comprising electron transporting layers (ETLs) comprising derivatives of cyclooctatetraene. These devices include OLEDs wherein the hole transporting layer (HTL) comprises the emissive molecules and these include OLEDs wherein there is a separate emissive layer.

The synthesis can be used to prepare any cyclooctatetraene (COT) derivative. The most general form is shown below and would be made from four different acetylene. The synthesis would couple these four acetylene randomly into COT derivatives.

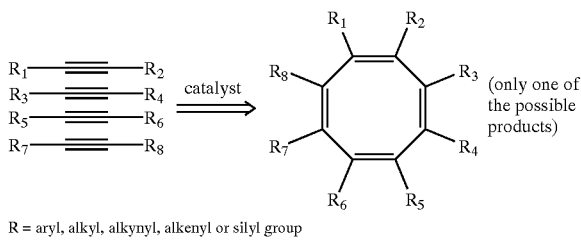

R = aryl, alkyl, alkynyl, alkenyl or silyl group

The invention is further directed to a cyclooctatetraene molecule of the formula

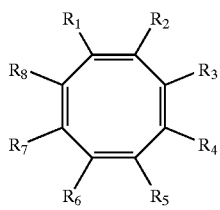

wherein $R_1$ through $R_8$ are selected from the group consisting of alkyl, aryl and alkynyl and wherein at least one member of $R_1$ through $R_8$ is different from the other members of $R_1$ through $R_8$. As an example, $R_1$ could be phenyl and $R_2$ through $R_8$ could be tolyl. Such a product could be obtained by use of two distinct alkyne monomers using the chemistry described below. The invention includes embodiments using more than one alkyne monomer.

The invention is also directed to the above-noted cyclooctatetraene molecule wherein $R_1$ through $R_8$ are selected such that only four members of the set $R_1$ through $R_8$ are identical, with the proviso that no three adjacent members of the set $R_1$ through $R_8$ are identical. The invention is also directed to the above-noted cyclooctatetraene molecule wherein $R_1$ through $R_8$ are selected such that there is a first group of four members of the set $R_1$ through $R_8$ that are identical and there is a second group consisting of the remaining four members of the set $R_1$ through $R_8$ that are identical, with the proviso that the members of the first group are different from the members of the second group and that no three adjacent members of the set $R_1$ through $R_8$ are identical. An example would be $R_1$, $R_3$, $R_5$, and $R_7$ equal to phenyl and $R_2$, $R_4$, $R_6$, and $R_8$ equal to tolyl. This embodiment would not allow $R_1$, $R_2$, and $R_3$ (adjacent members) to each be phenyl.

The substituents $R_1$ through $R_8$ may be derived from arene molecules. By the term "derived from" we mean that as in a naphthyl substituent is derived from a naphthalene molecule. The substituents may be phenyl, tolyl, naphthyl, thienyl and benzthienyl. The substituents $R_1$ through $R_8$ may be derived from aromatic hydrocarbons substituted with an electron withdrawing group or groups as exemplified by, but not limited by, CN, halogen, nitro, carbonyl and imine. The substitutuents $R_1$ through $R_8$ may be derived from heteroaromatic quinolines and pyridines. The substituents may be of different geometrical isomers as those in COT derivatives arising from di-p-tolylbutadiyne, di-o-tolylbutadiyne, and di-m-tolylbutadiyne.

In an embodiment using a single alkyne monomer, one could have four members of the set $R_1$ to $R_8$ identical (such as four members equal to phenyl), with the other four members of the set $R_1$ to $R_8$ identical (such as four member equal to tolyl), with the proviso that no three adjacent members of $R_1$ to $R_8$ are identical. To define the term "adjacent to" with reference to the above figure, $R_3$ is adjacent to $R_2$ and $R_4$, and similarly for the other members of $R_1$ to $R_8$. "Adjacent to" means "nearest to" in the sense that $R_3$ is nearest to $R_2$ and $R_4$ in the planar representation of the molecule.

Discussions of the appearance of color, including descriptions of CIE charts, may be found in Color Chemistry, VCH Publishers, 1991 and H. J. A. Dartnall, J. K. Bowmaker, and J. D. Mollon, Proc. Roy. Soc. B (London), 1983, 220, 115–130.

The catalyst dihydridocarbonyltri(triphenylphosphine) ruthenium can be activated by treatment with a stoichiometric amount of styrene at 135° C. This serves to remove hydrogen from the ruthenium complex and yields ethylbenzene and a site of coordinate unsaturation. (H. Guo, G. Wang, M. A. Tapsak, W. P. Weber, Macromolecules, 1995, 28, 5686)

Dihydridocarbonyltris (triphenylphosphine) ruthenium which has been activated by treatment with a stoichiometric amount of styrene catalyzes the cyclotetramerization of diphenylbutadiyne to give the unsymmetrical 1,2,4,6-tetraphenyl-3,5,7,8-tetrakis (phenylethynyl) cyclooctatetraene in high yield. When irradiated at 310–320 nm, solutions of this material fluoresce at 392 nm with a quantum yield of 16%. Solutions of the corresponding cyclooctatetraene derivative prepared from di-p-tolyl-butadiyne and di-p-methoxyphenylbutadiyne fluoresce at 402 nm and 412 nm with quantum yields of 47% and 79% respectively.

We find diphenylbutadiyne undergoes tetramerization on treatment with dihydrido carbonyl tris(triphenylphosphine) ruthenium, which has been activated by treatment with a stoichiometric amount of styrene. (H. Guo, G. Wang, M. A. Tapsak, W. P. Weber, Macromolecules, 1995, 28, 5686). Similar successful cyclotetramerization of di-p-tolylbutadiyne and di-p-methoxyphenylbutadiyne have been carried out.

There are distinct possible isomers for the products (see FIG. 9). In the case of the product of the ruthenium catalyzed tetramerization of diphenylbutadiyne, we find that nuclear magnetic resonance suggests the unsymmetrical cyclooctatetraene IV. Specifically, the 1H NMR of the cyclotetramer formed from di-p-tolylbutadiyne has seven resonances for the methyl groups. Six of these are of equal intensity while one has an intensity which is twice as large. Similarly, the 13C NMR of the cyclotetramer formed from di-p-methoxyphenyl butadiyne shows seven resonances due to non-equivalent methoxy groups. The intensity of one of these is twice that of the other signals. Eight distinct resonances for the acetylenic carbons are observed in the 13C NMR for the tetramer formed from diphenylbutadiyne.

V.B.2. Details

V.B.2.a Synthesis of Tetramer of Diphenylbutadiyne ("COT-H")

Dihydridocarbonyltris(triphenylphosphine)ruthenium (55.1 mg, 60 μmol), toluene 3 mL, and styrene (6.8 μl, 60 μmol) were placed in an Ace pressure tube. The tube and its contents were purged with nitrogen for a few minutes. The tube was sealed and heated at 110° C. until the color of the catalyst solution had changed to orange. This color change indicates that the catalyst has been activated (H. Guo.; G. Wang; M. A. Tapsak; W. P. Weber; *Macromolecules*, 28, 5686 (1995)). The tube and its contents were cooled at room temperature. The tube was opened under nitrogen and diphenylbutadiyne (404 mg, 2 mmol; available from Aldrich) was added. The solution was purged with nitrogen and the tube was sealed. The tube and its contents were heated at 135° C. overnight. The toluene solvent was removed by evaporation under reduced pressure. The residue was purified by column chromatography with silica gel and hexane/methylene chloride (4/1) as the eluent. In this way, 0.35 g, 86% yield, mp 219–220° C. was obtained. $^1$H NMR δ: 7.61 (dd, 4H, J=7.0 Hz), 7.43 (m, 8H), 7.15 (m, 20H), 7.05 (d, 2H J=7.5 Hz), 7.02 (d, 2H, J=7.5 Hz), 6.72 (d, 2H, J=7.5 Hz), 6.64 (d, 2H, J=7.5 Hz). $^{13}$C NMR δ: 146.49, 145.99, 143.65, 143.16, 139.79, 139.59, 139.47, 139.30, 131.47, 131.17, 130.69, 130.66, 130.47, 130.41, 128.28, 128.21, 128.17, 128.03, 127.99, 127.96, 127.65, 127.48, 127.39, 127.31, 127.21, 126.82, 126.80, 125.63, 125.30, 124.81, 123.50, 123.45, 123.24, 123.22, 123.19, 122.39, 98.58, 98.39, 97.34, 97.22, 88.97, 88.81, 88.27, 88.19. Forty-four carbon signals are observed. Structure IV should give rise to 48 carbons resonances. IR ν, 3056, 2920, 2211, 1951, 1883, 1804, 1755, 1669, 1597, 1490, 1442, 1406, 1275, 1175, 1070, 1026, 910, 841, 806, 754, 693 cm$^{-1}$ UV $\lambda_{max}$ nm(ε): 365(68000), 341(44000), 313(76000), 228(44000). Fluorescence $\lambda_{max}$ 392 nm in solution (quantum yield=16%) or $\lambda_{max}$ 408 nm as a solid film when excited at 310–320 nm. The $\lambda_{max}$ of the excitation spectrum is 392 nm. By TGA, the tetramer is stable to 310° C. Above 310° C., a steady loss of weight occurs. By 650° C., 98% of the initial sample weight is lost. DSC: T$_g$=177° C., Tm=220° C. MS: M$^+$(=molecular ion) Calc. for $(C_{16}H_{10})_4$ 808.3130 Found: 808.3159, the base peak corresponds to $(C_{16}H_{10})_3{}^+$.

Cyclic voltarnmetry in DMF showed a reduction potential of −1.59 V.

V.B.2.b. Tetramer of Di-p-tolylbutadiyne ("COT-Me" or "COT-CH3")

Dihydridocarbonyltris(triphenylphosphine) ruthenium (110 mg, 120 μmol), toluene 3 mL, and styrene (13.6 μl, 120 μmol) were placed in an Ace pressure tube for activating as above. Di-p-tolylbutadiyne (1.0 g, 1.1 mmol) was added. The solution was purged again with nitrogen and the pressure tube was sealed. The tube and its contents were heated at 135° C. overnight. After reaction, the product was purified by column chromatography (silica gel/hexane/ethyl acetate) to give a yellow solid (0.70 g), yield 70%, mp 263–265° C. by DSC T$_m$=265° C., and Tg=214° C. $^1$H NMR δ: 7.61 (dd, 4H, J=8 Hz), 7.32 (dd, 4H, J=8 M), 7.20 (d, 2H, J=8 Hz), 7.15 (dd, 4H, J=8 Hz), 7.08 (m, 10H), 6.98 (d, 2H, J=8 Hz), 6.95 (d, 2H, J=6.77 (d, 2H, J=8 Hz), 6.69 (d, 2H J=8 Hz), 2.50 (s, 3H, 2.49 (s, 3H, 2.34 (s, 3H), 2.33 (s, 3H), 2.32 (s, 6H), 2.28 (s, 3H), 2.27 (s, 3H). In toluene-d$_8$ solvent, eight different methyl peaks were observed: 2.56, 2.55, 2.33, 2.32, 2.26, 2.24, 2.19, 2.17 ppm.

Off resonance $^{13}$C NMR δ: 146.10 (t, $^3$J=3 Hz), 145.39 (t, $^3$J=3 Hz), 143.45 (t, $^3$J=3 Hz), 142.80 (t, $^3$J=3 Hz), 138.26 (t of q, $^2$J=8 Hz, $^3$J=2 Hz), 138.24 (t of q, $^2$J=8 Hz, $^3$J=2 Hz), 137.98 (t of q, $^2$J=8 Hz, $^3$J=2 Hz), 137.95 (t of q, $^2$J=8 Hz, 3J=2 Hz), 136.97 (t of q, 2J=8 Hz, 3J=2 Hz), 136.95 (t of q, 2J=8 Hz, 3J=2 Hz), 136.90 (t of q, 2J=8 Hz, 3J=2 Hz), 136.71 (t, 2J=7.5 Hz), 136.63 (t, 2J=7.5 Hz), 136.51 (t, 2J=7.5 Hz), 135.99 (t of q, 2J=8 Hz, 3J=2 Hz), 131.32 (d of d, V=163 Hz, 2J=6.5 M), 131.00 (d of d, V=163 Hz, 2J=6.5 Hz), 130.56 (d of d, 'J=163 Hz, 2J=6.5 Hz), 130.53 (d of d, 'J=163 Hz, 2J=6.5 Hz), 130.40 (d of d, 'J=163 Hz, 2J=6.5 Hz), 130.38 (d of d, 'J=163 Hz, 2J=6.5 Hz), 128.92 (d of d, 'J=163 Hz, 2J=6.5 Hz), 128.88 (d of d, 'J=163 Hz, 2J=6.5 Hz), 128.71 (d of d, V=163 Hz, 2J=6.5 Hz), 128.68 (d of d, V=163 Hz, 2J=6.5 Hz), 127.96 (d of d, V=163 Hz, 2J=6.5 Hz), 127.91 (d of d, V=163 Hz, 2J=6.5 Hz), 127.89 (d of d, V=163 Hz, 2J=6.51 U), 127.82 (d of d, V=163 Hz, 2J=6.5 Hz), 125.67(s), 124.59(s), 123.28(s), 122.29(s), 120.59 (t, 2J=8 Hz), 120.55 (t, 2J=8 Hz), 120.39 (t, 2J=8 Hz), 120.34 (t, 2J=8 Hz), 98.35 (t, 3J=5 Hz), 98.09 (t, 3J=5 Hz), 97.06 (t, 3J=5 Hz), 96.91 (t, 3J=5 Hz), 88.72(s), 88.70(s), 88.06(s), 87.99(s), 21.48 (t of q, V=127 Hz, 3J=5 Hz), 21.46 (t of q, V=127 Hz, 3J=5 Hz), 21.41 (t of q, V 127 Hz, 3J=5 Hz), 21.24 (t of q, V=127 Hz, 3J=5 Hz), 21.23 (t of q, 127 Hz, 3J=5 Hz).

Fifty carbon resonances are observed. Structure IV should give rise to 56 carbon signals.

From the off resonance $^{13}$C NMR spectra, the eight signals due to acetylenic carbons can be divided into two groups. Four carbons are split to triplet, while the other four carbons are singlet. The four carbon triplets are due to long range three bond coupling by the two ortho aromatic protons adjacent to triple bond. The other four carbon singlets indicate that they are connected to the ipso carbon. This is consistent with four different p-tolylethynyl groups.

IR ν: 3026, 2920, 2860, 2209, 1904, 1611, 1511, 1446, 1415, 1215, 1178, 1112, 1021, 815, 758 cm$^{-1}$. UV $\lambda_{max}$ (ε): 366 (49800), 317 (73000), 245 (32600). Fluorescence $\lambda_{max}$ 402 nm (quantum yield=47%) when excited at 310–320 nm. The $\lambda_{max}$ of the excitation spectrum is 375 nm. TGA: The tetramer is stable until 360° C. Above this temperature, the material undergoes catastrophic decomposition. From 360 to 600° C., 97% of the initial sample weight is lost.

Cyclic voltammetry in DMF showed a reduction potential of −1.71 V.

The preparation of the intermediate di-p-tolylbutadiyne is as follows. In a 100 mL round bottom flask equipped with a gas inlet tube, was placed a Teflon covered magnetic stirring bar, p-tolylacetylene (5.0 g, 43 mmol), methanol 5 mL, pyridine 1.25 mL, and CuCl (0.2 g, 2 mmol). The reaction mixture was vigorously stirred while air was bubbled through it (A. Vogel, *Vogel's Textbook of Practical Organic Chemistry*, 4th Ed. Longman, London, England, 1978, p 351) Concentrated HCl (2 mL) and saturated sodium chloride (10 mL) was added. The precipitate was isolated by filtration. It was washed with water, dried, and recrystallized from toluene to give 3.45 g, 69% yield, mp 181–183° C. (Lit, 183° C. (Kunckell, *Chem. Zentralblatt*, 1913, I, 1768)). $^1$H NMR δ: 7.40 (d, 4H, J=8.25 Hz), 7.12 (d, 4K J=8.25 Hz), 2.35 (s, 6H). By preparing the intermediates di-m-tolylbutadiyne or di-o-tolylbutadiyne, one could make other tetramers which are expected to have different glass transition and melting points from that derived from di-p-tolylbutadiyne.

V.B.2.c. Tetramer of di-p-methoxyphenylbutadiyne. ("COT-CH3O")

Di-p-methoxyphenylbutadiyne was treated with activated ruthenium catalyst as above. After purification, the unsymmetrical cyclic tetramer was obtained in 29%, mp, 199–200° C. $^1$H NMR δ: 7.62 (d, 2H, J=8.5 Hz), 7.61 (d, 2K J=8.5 Hz), 7.21 (d, 2FL J 8.5 Hz), 7.14 (d, 4K J=8.5 Hz), 7.12 (d, 21L J=8.5 Hz), 7.02 (d, 2H,J=8.5 Hz), 7.01 (d, 2I-L J=8.5 Hz), 6.84–6.64 (m, 16H), 3.86 (s, 3H), 3.85 (s, 3H), 3.74 (s, 3H), 3.73 (s, 3H), 3.72 (s, 6H), 3.69 (s, 3H), 3.68 (s, 3M. $^{13}$C NMR δ: 159.61, 159.42 159.08, 158.22, 145.16, 144.64, 142.84, 142.27, 132.91, 132.61, 132.48, 132.38, 132.27, 132.22, 132.14, 132.07, 131.98, 131.92, 131.90, 131.84, 128.53, 128.43, 125.58, 124.68, 123.41, 122.51, 115.87, 115.84, 115.65, 115.62, 113.91, 113.89, 113.71, 113.70, 112.73, 112.67, 112.64, 98.14, 97.91, 86.90, 96.76, 88.26, 88.23, 87.57, 87.52, 55.45, 55.43, 55.29, 55.28, 55.26, 55.23, 55.20, 55.18. Fifty-three carbon resonances are observed. The unsymmetrical cyclic tetramer should give rise to fifty-six signals. IR: 2952, 2921, 2850, 2207, 1730, 1606, 1511, 1463, 1437, 1417, 1290, 1251, 1170, 1106, 1029, 830, 774 cm$^{-1}$ U $\lambda_{max}$ nm(ε) 365 (50000) 325–399 (65000): Fluorescence $\lambda_{max}$ 412 nm (quantum yield=79%) when excited at 310–320 nm. The $\lambda_{max}$ of the excitation spectrum is 375 nm.

By DSC, Tg 194° C., Tm 200° C. TGA: The tetramer is stable until 335° C. Above this temperature, the material undergoes catastrophic decomposition. From 335° C. to 566° C., 94% of the initial sample weight is lost.

V.B.2.d. Synthesis of tetramer of bis-(β-naphthyl)-1,4-butadiyne Dihydridocarbonyltristriphenylphosphine (27.54 mg, 30 μmol), toluene 2 mL, and styrene (3.4 μl, 30 μmol) were placed in an Ace pressure tube. The tube and its contents were purged with nitrogen for a few minutes. The tube was sealed and heated at 110° C. until the color changed to orange. It was cooled to room temperature, bis-(β-naphthyl)-1,4-butadiyne(0.302 g, 1 mmol) was added to the tube. It was purged with nitrogen, and sealed. The tube and its contents were heated at 135° C. overnight. After removing the toluene by evaporation, the residue was purified by column chromatography. In this way, 0.1 g, 33% yield was obtained. Eight acetylenic carbons in $^{13}$C NMR were observed. δ: 99.58, 99.48, 98.33, 98.23, 89.66, 89.51, 88.94, 88.92. respectively.

V.B.2.e. Synthesis of tetramer of bis(3-thienyl)-1,4-butadiyne ("COT-S")

The catalyst was activated as above. bis(3-Thienyl)-1,4-butadiyne (0.214 g, 1 mmol) was added to the tube. It was purged with nitrogen, and sealed. The tube and its contents were heated at 135° C. overnight. After removing the toluene by evaporation, the residue was purified by column chromatography. In this way, 0.12 g, 56% yield was obtained. $^1$H NMR: δ: 7.70 (s, 1H) 7.67 (s, 1H), 7.51 (d, 1H, J=1.5 Hz), 7.48 (d, 1H, J=1.5 Hz), 7.42 (m, 2H), 7.37 (s, 1H), 7.32 (s, 1H), 7.27 (3H, m), 7.20 (5H, m), 7.11 (s, 1H), 7.08 (s, 1H), 7.04 (d, 1H, J=1.5 Hz), 6.99 (d, 1H, J=1.5 Hz), 6.95 (d, 2H, J=1.5 Hz), 6.79 (d, 1H, J=1.5 Hz), 6.74 (d, 1H, J=1.5 Hz). Eight acetylenic carbons in $^{13}$C NMR were observed. δ: 93.61, 93.48, 92.6, 92.52, 88.31, 88.20, 87.71, 87.63, respectively. By TGA, this material is stable to 310° C., from 310° C. to 640° C., 97% of the initial weight is steadily lost.

Cyclic voltammetry in DMF showed a reduction potential of –1.68 V.

V.B.2.f. Synthesis of tetramer of bis-(4-trifluoromethylphenyl)-1,4-butadiyne

The catalyst was activated as above. bis-(4-Trifluoromethylphenyl)-1,4-butadiyne (0.338 g, 1 mmol) was added to the tube. It was purged with nitrogen, and sealed. The tube and its contents were heated at 135° C. overnight. After removing the toluene by evaporation, the residue was purified by column chromatography. In this way, 0. I g, 29% yield was obtained. $^1$H NMR δ: 7.83 (d, 2H, J=8 Hz), 7.77 (d, 2H, J=8 Hz), 7.59 (m, 14 H), 7.37 (dd, 8H, J=8 Hz), 7.25 (d, 2H, J=8 Hz), 7.14 (d, 2H, J=8 Hz), 6.68 (d, 2H, J=8 Hz). Eight acetylenic carbons in $^{13}$C NMR were observed. δ: 98.59, 98.56, 97.25, 89.51, 89.09, 88.80, 80.96, 75.62, respectively.

V.B.3 Cyclic voltammetry

In a separate embodiment of the present invention, we note that cyclic voltammetry of the tetramers (including H-COT and Me-COT) allows measurement of the energy of the lowest unoccupied molecular orbital ("LUMO") (which gives an estimate of energy of injected electron in COT material) which allows systematic prediction of optimum devices. The reduction potential of a compound measured by cyclic voltammetry correlates with the LUMO energy of the compound; knowledge of the LUMO of a given COT derivative allows one of ordinary skill to select appropriate, optimum components for use in an OLED. [The reduction potentials reported herein are vs. the saturated calomel electrode (SCE).]

V. C. Other Molecular Depictions

A molecule for the hole-transporting layer of the invention is depicted below.

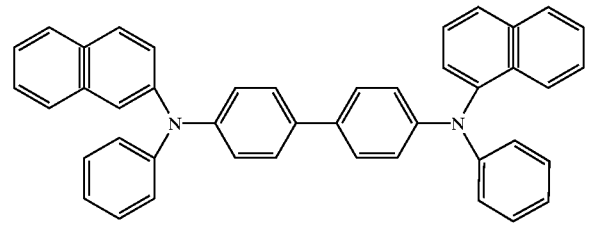

The invention will work with other hole-transporting molecules known by one of ordinary skill to work in hole transporting layers of OLEDs.

A molecule which could be used as the host in the emissive layer of the invention is depicted below.

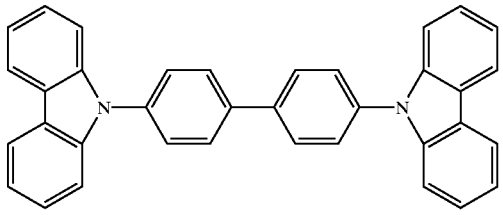

The invention will work with other molecules known by one of ordinary skill to work as hosts of emissive layers of OLEDs. For example, the host material could be a hole-transporting matrix and could be selected from the group consisting of substituted tri-aryl amines and polyvinylcarbazoles.

FIGS. 10–19 give additional data on the molecules of this invention.

V.D. Uses of Device

The OLED of the present invention may be used in substantially any type of device which is comprised of an OLED, for example, in OLEDs that are incorporated into a larger display, a vehicle, a computer, a television, a printer, a large area wall, theater or stadium screen, a billboard or a sign.

The present invention as disclosed herein may be used in conjunction with co-pending applications: "High Reliability, High Efficiency, Integratable Organic Light Emitting Devices and Methods of Producing Same", Ser. No. 08/774, 119 (filed Dec. 23, 1996), now U.S. Pat. No. 6, 046,543; "Novel Materials for Multicolor LED's", Ser. No. 08/850, 264 (filed May 2, 1997), now U.S. Pat. No. 6,045,930; "Electron Transporting and Light Emitting Layers Based on Organic Free Radicals", Ser. No. 08/774,120 (filed Dec. 23, 1996), now U.S. Pat. No. 5,811,833; "Multicolor Display Devices", Ser. No. 08/772,333 (filed Dec. 23, 1996), now U.S. Pat. No. 6,013,982; "Red-Emitting Organic Light Emitting Devices (OLED's)", Ser. No. 08/774,087 (filed Dec. 23, 1996), now U.S. Pat. No. 6,048,630; "Driving Circuit For Stacked Organic Light Emitting Devices", Ser. No. 08/792, 050 (filed Feb. 3, 1997), now U.S. Pat. No. 5,757,139; "High Efficiency Organic Light Emitting Device Structures", Ser. No. 08/772,332 (filed Dec. 23, 1996), now U.S. Pat. No. 5,834,893; "Vacuum Deposited, Non-Polymeric Flexible Organic Light Emitting Devices", Ser. No. 08/789,319 (filed Jan. 23, 1997), now U.S. Pat. No. 5,844,363; "Displays Having Mesa Pixel Configuration", Ser. No. 08/794,595 (filed Feb. 3, 1997), now U.S. Pat. No. 6,091,195; "Stacked Organic Light Emitting Devices", Ser. No. 08/792,046 (filed Feb. 3,1997), now U.S. Pat. No. 5,917,280; "High Contrast Transparent Organic Light Emitting Device Display", Ser. No. 08/821,380 (filed Mar. 20, 1997), now U.S. Pat. No. 5,986,401; "Organic Light Emitting Devices Containing A Metal Complex of 5-Hydroxy-Quinoxaline as A Host Material", Ser. No. 08/838,099 (filed Apr. 14, 1997), now U.S. Pat. No. 5,861,219; "Light Emitting Devices Having High Brightness", Ser. No. 08/844,353 (filed Apr. 18,1997), now U.S. Pat. No. 6,125,226; "Organic Semiconductor Laser", Ser. No. 60/046,061 (filed May 9, 1997); "Organic Semiconductor Laser", Ser. No. 08/859,468 (filed May 19, 1997), now U.S. Pat. No. 6,111,902; "Saturated Full Color Stacked Organic Light Emitting Devices", Ser. No. 08/858, 994 (filed May 20, 1997), now U.S. Pat. No. 5,932,895; "Plasma Treatment of Conductive Layers", Ser. No. PCT/US97/10252, (filed Jun. 12, 1997); "Novel Materials for Multicolor Light Emitting Diodes", Ser. No. 08/814,976 (filed Mar. 11, 1997), now abandoned; "Novel Materials for Multicolor Light Emitting Diodes", Ser. No. 08/771,815 (filed Dec. 23, 1996), converted to provisional application No. 60/072,095; "Patterning of Thin Films for the Fabrication of Organic Multi-Color Displays", Ser. No. PCT/US97/10289, (filed Jun. 12, 1997); and "Double Heterostructure Infrared and Vertical Cavity Surface Emitting Organic Lasers", Ser. No. PCT/US98/09480 (filed May 8, 1998); U.S. Pat. Nos. 5,874,803; 5,707,745; 5,703,436; and 5,757, 026 each co-pending application or patent being incorporated herein by reference in its entirety.

What is claimed:

1. An organic light emitting device comprising:
   an anode;
   a hole transporting layer;
   an electron transporting layer comprising a substituted cyclooctatetraene,
      wherein the substituted cyclooctatetraene is selected from the group consisting of a cyclooctatetraene molecule of the formula

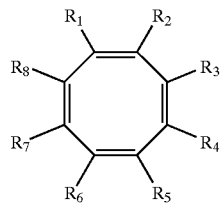

wherein $R_1$ through $R_8$ are selected from the group consisting of aryl and arylalkynyl groups which may be further substituted, wherein there is a first group of four members of the set $R_1$ through $R_8$ that are identical and there is a second group consisting of the remaining four members of the set $R_1$ through $R_8$ that are identical, with the proviso that the members of the first group are different from the members of the second group and no three adjacent members of the set $R_1$ through $R_8$ are identical; and a cathode.

2. The organic light emitting device of claim 1, used in a member of the group consisting of a larger display, a vehicle, a computer, a television, a printer, a large area wall, theater or stadium screen, a billboard and a sign.

3. The organic light emitting device of claim 1, further comprising:
   a separate emissive layer comprising an emissive molecule, wherein the emissive molecule is selected from the group consisting of an emissive molecule and a combination of a host material and an emissive molecule, present as a dopant in said host material.

4. The organic light emitting device of claim 1, wherein the hole transporting layer comprises an emissive molecule wherein the emissive molecule is selected from the group consisting of an emissive molecule and a combination of a host material and an emissive molecule, present as a dopant in said host material.

5. The organic light emitting device of claim 1, wherein the electron transporting layer further comprises an emissive molecule wherein the emissive molecule is selected from the group consisting of an emissive molecule and a combination of a host material and an emissive molecule, present as a dopant in said host material.

6. The organic light emitting device of claim 1, wherein the substituted cyclooctatetraene is selected from the group consisting of a cyclooctatetraene molecule of the formula

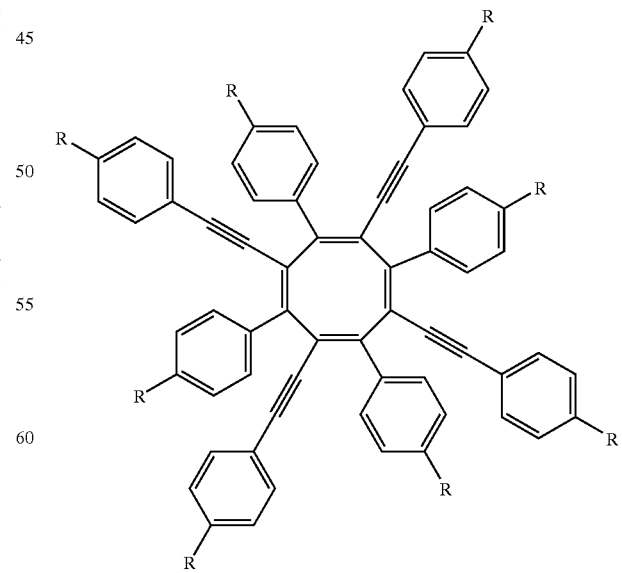

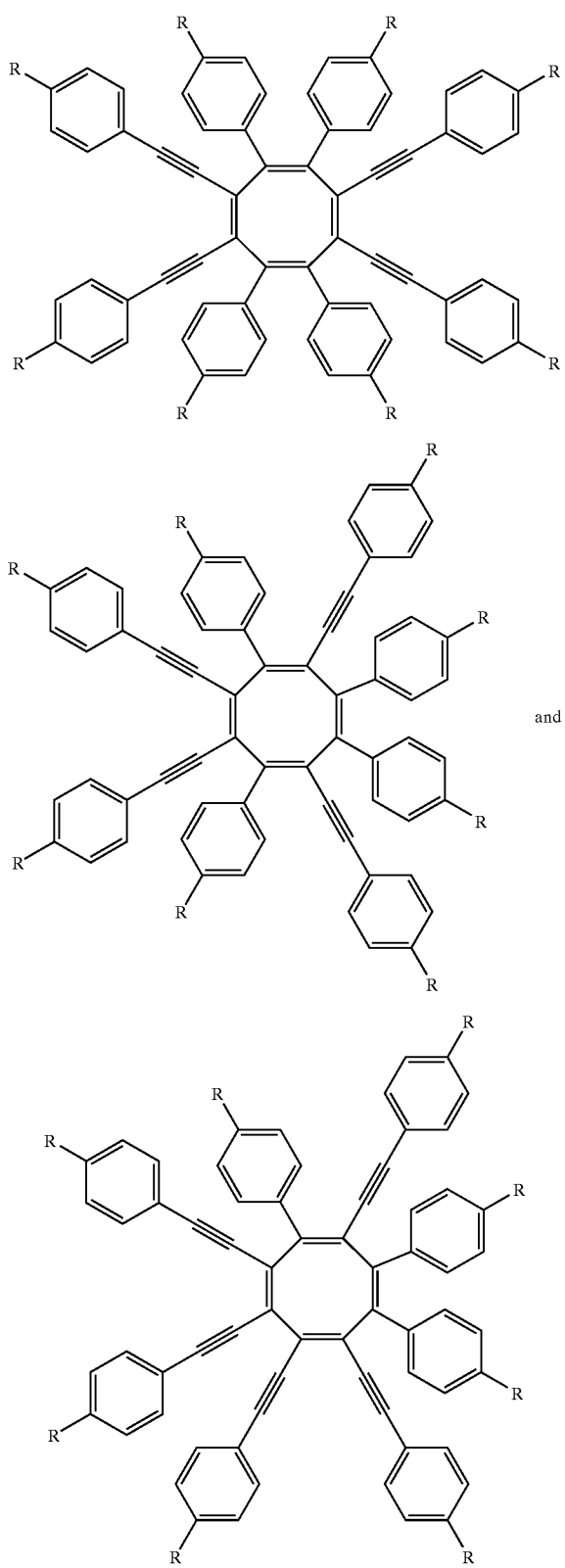
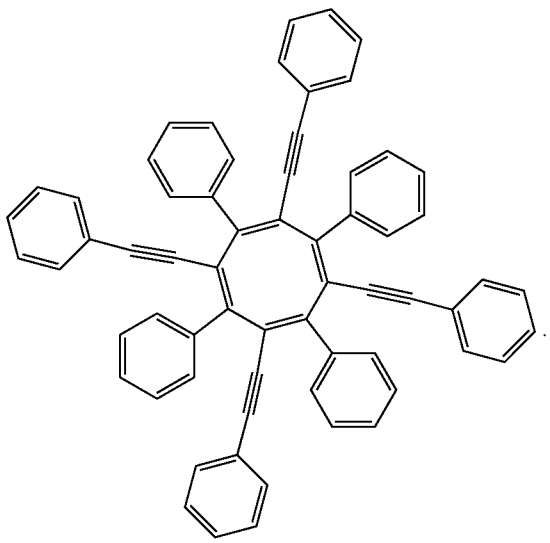
wherein R = H, CH₃ or CH₃O.
7. The organic light emitting device of claim 6, wherein the substituted cyclooctatetraene has the following formula
and
8. The organic light emitting device of claim 6, wherein the substituted cyclooctatetraene has the following formula
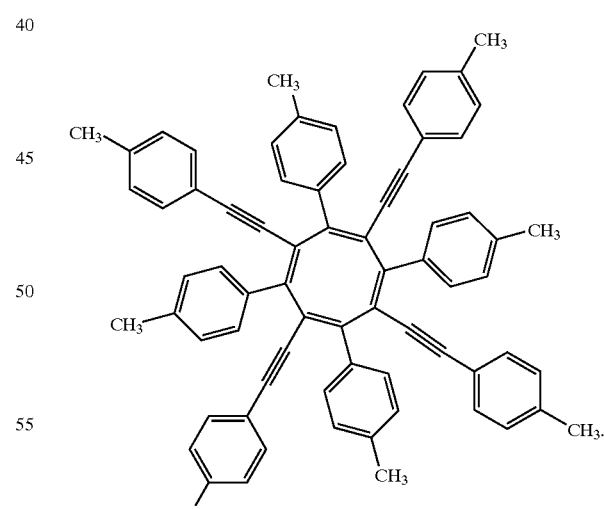
\* \* \* \* \*

UNITED STATES PATENT AND TRADEMARK OFFICE
CERTIFICATE OF CORRECTION

PATENT NO. : 6,506,505 B1
DATED : January 14, 2003
INVENTOR(S) : Weber et al.

It is certified that error appears in the above-identified patent and that said Letters Patent is hereby corrected as shown below:

<u>Title page,</u>
Item [57], ABSTRACT,
Line 1, after "devices" insert -- are described wherein --

<u>Column 8,</u>
Line 6, after "layer." delete "FIG. 4. IV",
Line 7, insert -- FIG. 4. IV -- before "characteristics"; and <u>Column 13,</u>
Line 55, change "voltarnmetry" to -- voltammetry --.

Signed and Sealed this

Twentieth Day of January, 2004

JON W. DUDAS
*Acting Director of the United States Patent and Trademark Office*